US012610516B2

(12) United States Patent
Han

(10) Patent No.: US 12,610,516 B2
(45) Date of Patent: Apr. 21, 2026

(54) SEMICONDUCTOR STRUCTURE AND METHOD MAKING THE SAME

(71) Applicant: ChangXin Memory Technologies, Inc., Hefei City (CN)

(72) Inventor: Qinghua Han, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 576 days.

(21) Appl. No.: 18/163,072

(22) Filed: Feb. 1, 2023

(65) Prior Publication Data

US 2024/0098963 A1    Mar. 21, 2024

(30) Foreign Application Priority Data

Sep. 19, 2022    (CN) .......................... 202211139858.7

(51) Int. Cl.
*H10B 12/00* (2023.01)

(52) U.S. Cl.
CPC ............. *H10B 12/00* (2023.02); *H10B 12/01* (2023.02); *H10B 12/20* (2023.02)

(58) Field of Classification Search
None
See application file for complete search history.

(56) References Cited

U.S. PATENT DOCUMENTS

| | | | | |
|---|---|---|---|---|
| 6,974,989 | B1* | 12/2005 | Chen ...................... | H10B 69/00 |
| | | | | 438/689 |
| 2019/0138893 | A1* | 5/2019 | Sharma .................. | G06N 3/065 |
| 2020/0020718 | A1* | 1/2020 | Harari ............... | H01L 21/02532 |
| 2020/0066326 | A1* | 2/2020 | Rios ..................... | G11C 11/409 |
| 2020/0220022 | A1* | 7/2020 | Sills ...................... | H01L 21/764 |
| 2020/0279850 | A1* | 9/2020 | Sharma .................. | H10D 87/00 |
| 2021/0151437 | A1* | 5/2021 | Tomishima ....... | H01L 21/47635 |
| 2023/0122541 | A1* | 4/2023 | Im .......................... | H10B 12/20 |
| | | | | 257/314 |
| 2023/0292484 | A1* | 9/2023 | Im ...................... | G11C 11/2259 |

FOREIGN PATENT DOCUMENTS

CN          114334980 A      4/2022

* cited by examiner

*Primary Examiner* — Kretelia Graham
*Assistant Examiner* — William Henry Anderson
(74) *Attorney, Agent, or Firm* — Syncoda LLC; Feng Ma

(57) ABSTRACT

The present disclosure provides a semiconductor structure including: a channel on a semiconductor substrate for a first transistor; first bit lines are in contact with the first doped region arranged along the first direction; first word lines surround the channel region; the gate conductive layer and the second doped region, the channel layer arranged around the outer side of the gate conductive layer; the first semiconductor doped layer and the second semiconductor doped layer arranged on the outer side of the channel layer, so the channel layer and the gate conductive layer constitute the second transistor. The second bit line is in contact with either the first semiconductor doped layer or the second semiconductor doped layer; the second word line is in contact with the other one of the first semiconductor or the second semiconductor doped layer. The structure forms a new 2T0C DRAM structure.

15 Claims, 21 Drawing Sheets

SEMICONDUCTOR STRUCTURE AND METHOD MAKING THE SAME

TECHNICAL FIELD

The present disclosure relates to the field of semiconductors, in particular, to a semiconductor structure and a method for fabricating the structure.

BACKGROUND

The continuous growth of semiconductor market demand has pushed the rapid semiconductor memory technology development, the dynamic random access memory (DRAM) technology is especially the most important area in the memory market. A common DRAM cell includes a transistor and a capacitor which form an 1T1C structure. In order to improve cell performance and reduce cell area, it is necessary to make capacitors with large capacitance values per unit area.

With higher requirements on the memory performance and cell size of DRAM cells, the 1T1C cells have encountered severe challenges. Studies have shown that transistors with a certain size and appropriate dopants can also hold a limited amount of charges without requiring any capacitor, because the gate of the transistor is a natural capacitor. It is possible to fabricate a 2T0C embedded DRAM structure, which is a structure with two transistors without a capacitor, so it is necessary to provide a new 2T0C DRAM structure.

SUMMARY

Embodiments of the present disclosure provide a new semiconductor DRAM 2T0C structure and a fabrication method thereof.

According to the present disclosure, one embodiment of a semiconductor structure comprises: a substrate, and a plurality of semiconductor channels disposed on the substrate and spaced along a first direction and a second direction, the semiconductor channels include a first doped region, a channel region and a second doped region sequentially arranged along the third direction; each of the semiconductor channels is formed in one first transistor; the plurality of the first bit lines extending in the first direction and arranged at intervals along the first direction, are located between the substrate and the semiconductor channels, each of the first bit lines is connected to the first doped regains arranged along the first direction; a plurality of first word lines extending along the second direction and spaced apart along the first direction surrounds the channel regions; a gate conductive layer, the gate conductive layer is connected with the second doped region, and is located on the side of the second doped region away from the channel region; the channel layer surrounds the gate conductive layer and is arranged on the outer side of the channel layer; the first semiconductor doped layer is spaced apart from the second semiconductor doped layer; the first semiconductor doped layer, the second semiconductor doped layer, the channel layer and the gate conductive layer constitute the second transistor; a second bit line, the second bit line is electrically connected to one of the first semiconductor doped layer or the second semiconductor doped layer; a second word line, the second word line is electrically connected to the first semiconductor doped layer or the second semiconductor doped layer.

Another embodiment of the present disclosure further provides a method for fabricating a semiconductor structure, including: providing a substrate; a semiconductor channel and a gate conductive layer, the semiconductor channel includes a first doped region, a channel region and a second doped region sequentially arranged along the third direction, each of the semiconductor channels is formed in a first transistor, so the gate conductive layer is in contact with the second doped region and is located on the outer side of the second doped region away from the channel region; forming a plurality of first bit lines extending along the first direction and spaced apart arranged along the second a direction, herein the first bit lines are located between the substrate and the semiconductor channels, and the first bit lines are connected with each of the first doped regions arranged along the first direction; forming a plurality of first word lines extending along the second direction and spaced apart along the first direction, the first word lines surround the channel regions; forming a channel layer, the channel layer is arranged around the outer side of the gate conductive layer; a first semiconductor doped layer and forming a second semiconductor doped layer, and the first semiconductor doped layer and the second semiconductor doped layer, arranged on the outer side of the channel layer; and forming the first semiconductor doped layer spaced apart from the second semiconductor doped layer; herein the first semiconductor doped layer, the second semiconductor doped layer, the channel layer and the gate conductive layer are used to form a second transistor; forming a second bit line, herein the second bit line form contact-connect with one of the first semiconductor doped layer or the second semiconductor doped layer; forming a second word line, the second word line is in contact connection with the one of the first semiconductor doped layer or the second semiconductor doped layer.

The technical solutions provided by the embodiments of the present disclosure have at least the following advantages: a semiconductor channel is provided to form a first transistor, a first bit line is used for contact-connection with the first doped region, and a first word line surrounds the channel region to achieve controlled turn-off of the first transistor, and charges are transported and stored to the gate conductive layer of the second transistor. The gate conductive layer is in contact with the second doped region so that the charge from the first transistor can be received. The gate conductive layer, the channel layer, the first semiconductor doped layer and the second semiconductor doped layer constitute a second transistor to form a 2T0C DRAM structure, and the second bit line is connected to one of the first semiconductor doped layer or the second semiconductor doped layer. contact, the second word line is in contact with one of the first semiconductor doped layer or the second semiconductor doped layer, which can realize the reading function of the entire semiconductor structure. The embodiment of the present disclosure seeks reducing the manufacturing challenge of the production process, and at the same time the 2T0C DRAM structure provided possesses a higher integration density.

BRIEF DESCRIPTION OF THE DRAWINGS

One or more embodiments are exemplified by the pictures in the accompanying drawings, and these exemplary descriptions do not constitute limitations on the embodiments, unless otherwise stated, the drawings in the accompanying drawings do not constitute scale limitations; in order to more clearly illustrate the technical solutions in the embodiments of the present disclosure or in the traditional technology, the accompanying drawings required in the embodiments will be briefly introduced below. Obviously, the drawings in the following description are only some embodiments of the present disclosure, for those of ordinary skill in the art, other drawings can also be obtained based on these drawings without any creative effort.

DETAILED DESCRIPTION OF THE PREFERRED EMBODIMENTS

It can be known from the background art that, as the integration level continues to shrink, the process of forming the capacitor becomes more and more difficult.

The embodiments of the present disclosure provide a semiconductor structure and a method for fabricating the same, realize read and write of the semiconductor structure by using transistors instead of capacitors, set a semiconductor channel to form a first transistor, and use a first bit line and a first doping The region contact connection transfers charges to the gate conductive layer of the second transistor, surrounds the channel region through the first word line, so as to control the turn-off of the first transistor, and the gate conductive layer is in contact with the second doped region so that it can receive electrical charges from the gate conductive layer. The charge of the first transistor forms the second transistor through the gate conductive layer, the channel layer, the first semiconductor doped layer and the second semiconductor doped layer to form a 2T0C DRAM structure, and is doped with the first semiconductor through the second bit line. One of the doped layer or the second semiconductor doped layer is in contact, and the second word line is in contact with the other one of the first semiconductor doped layer or the second semiconductor doped layer, so that the read function of the entire semiconductor structure can be realized.

The embodiments of the present disclosure will be described in detail below with reference to the accompanying drawings. However, those of ordinary skill in the art can appreciate that in the various embodiments of the present disclosure, many technical details are set forth for the reader to better understand the present disclosure. However, even without these technical details and various changes and modifications based on the following embodiments, the technical solutions claimed in the present disclosure can be implemented.

Figure 1:
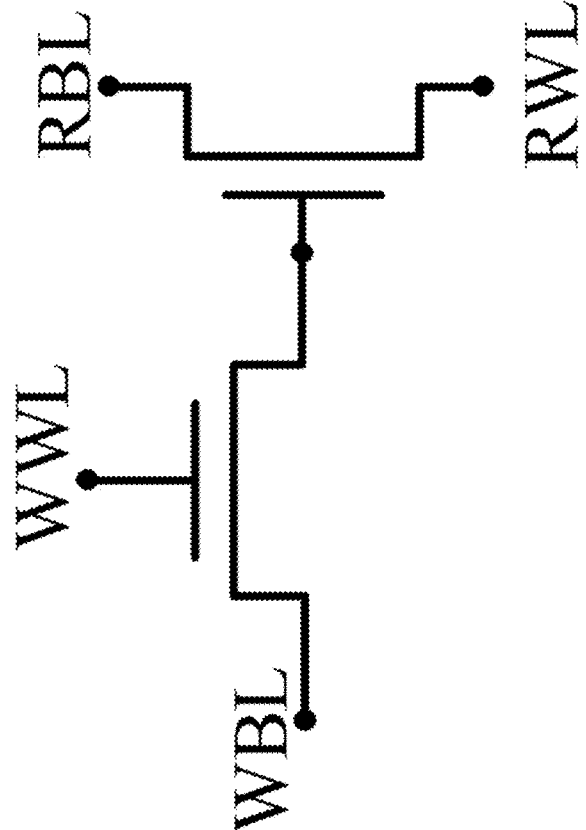
FIG. 1 is a schematic circuit diagram of a semiconductor structure according to one embodiment of the present disclosure.

Referring to FIG. 1, FIG. 1 is a schematic circuit diagram of a 2T0C DRAM structure according to an embodiment of the present disclosure. The working principle of writing is: supply a high voltage to the first word line WWL and the first bit line WBL, and pass the first word line WWL controls the conduction of the first transistor, and provides charge to the gate of the second transistor through the first bit line WBL, and the charge is stored in the gate of the second transistor, completing the process of writing "1", to the first word line WWL A high voltage is provided, and a low voltage is provided to the first bit line WBL. At this time, the charge stored in the gate of the second transistor flows to the first bit line WBL, and is discharged through the first bit line WBL. The gate of the second transistor there is no charge in it, and the process of writing "0" is completed; the working principle of reading is: when the gate of the second transistor stores charge, the second transistor can be turned on, and the second word line RWL and the second bit line RBL The current can flow during the time, and the process of reading "1" is completed. When there is no charge in the gate of the second transistor, the second transistor cannot be turned on, and there is no current between the second word line RWL and the second bit line RBL, complete Read "0" processing.

Figure 2:
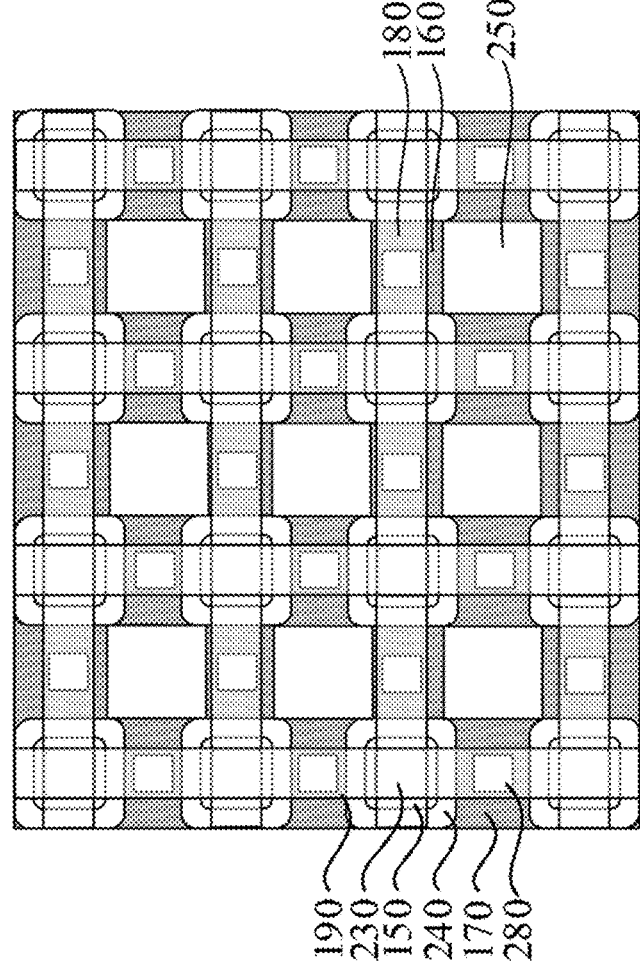
FIG. 2 is a top view of a semiconductor structure according to one embodiment of the present disclosure.
Figure 3:
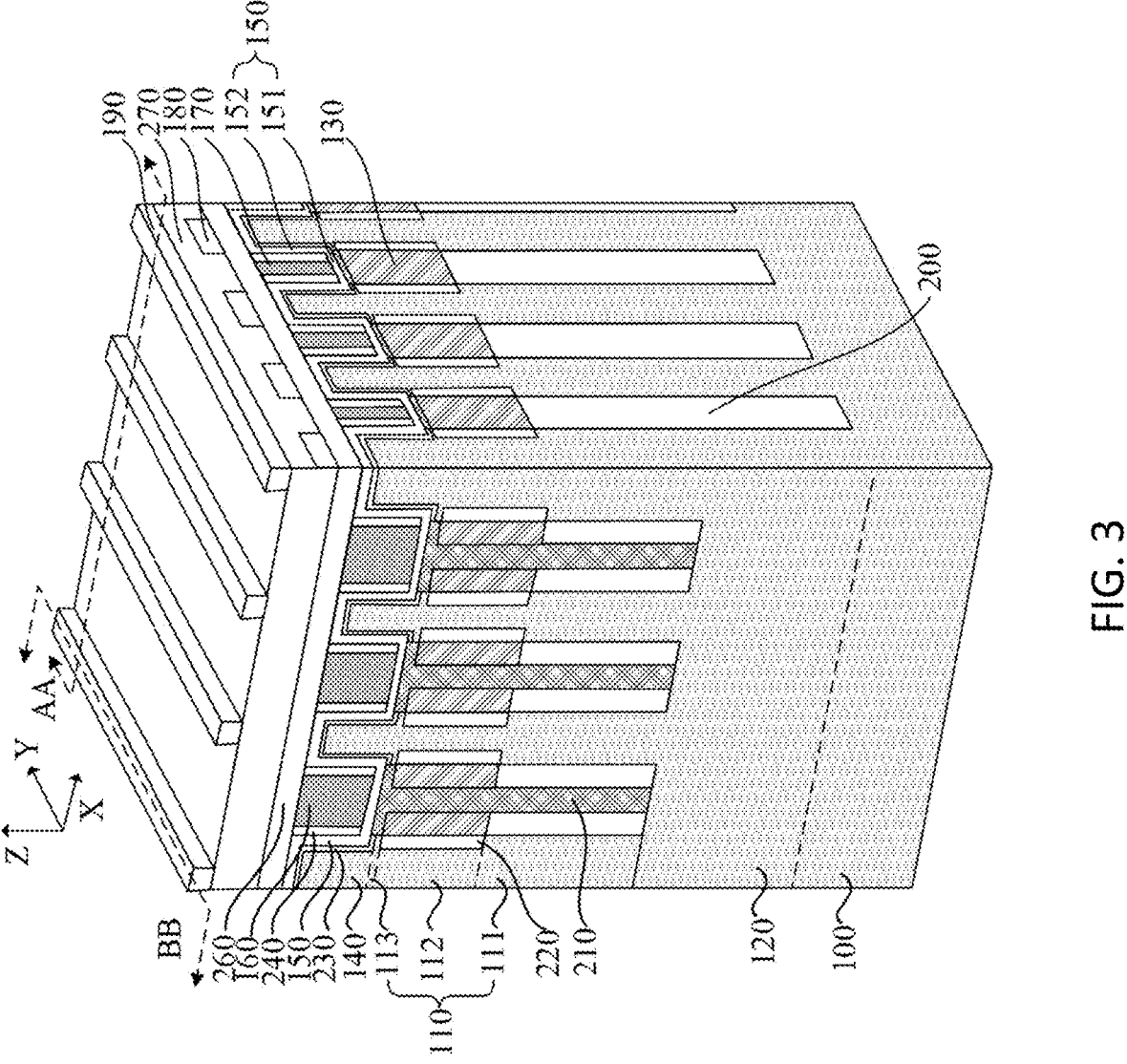
FIG. 3 is a perspective view of a semiconductor structure according to one embodiment of the present disclosure.
Figure 4:
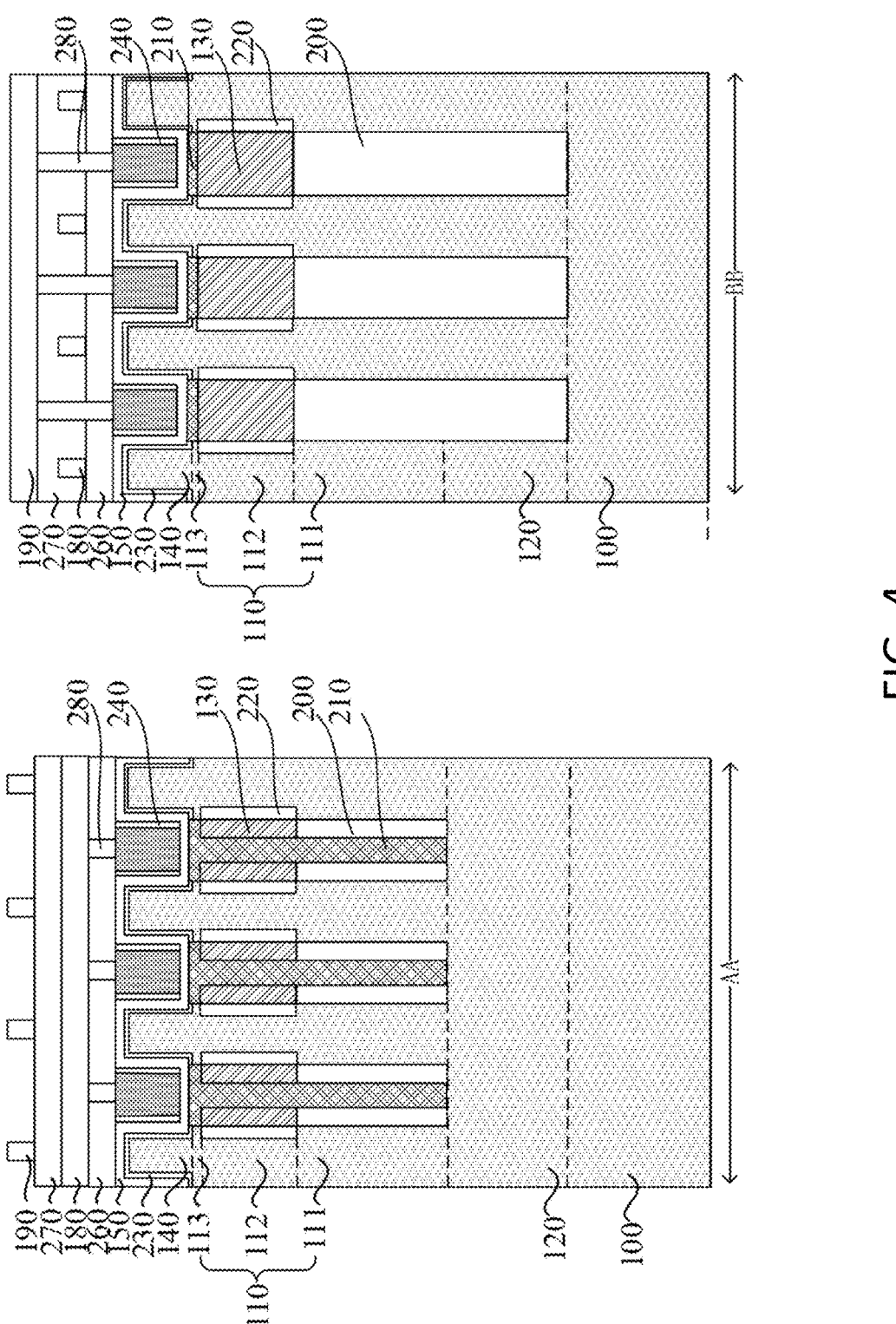
FIG. 4 is a cross-sectional view of a semiconductor structure provided by an embodiment of the present disclosure.

Referring to FIGS. 2 to 4, FIG. 2 is a top view of a semiconductor structure according to an embodiment of the disclosure, FIG. 3 is a perspective view of a semiconductor structure according to one embodiment of the present disclosure, and FIG. 4 a cross-sectional view of a semiconductor structure along the dashed line in FIG. 3 provided by an embodiment of the present disclosure.

Specifically, the semiconductor structure includes: a substrate 100 and a plurality of semiconductor channels 110 arranged on the substrate 100 at intervals along the first direction X and the second direction Y, and the semiconductor channel 110 includes first and second semiconductor channels 110 arranged in sequence along the third direction Z Doping region 111, channel region 112 and second doped region 113, each semiconductor channel 110 is used to form a first transistor; a plurality of first bits extending along the first direction X and spaced along the second direction Y Lines 120, the first line 120 is located between the substrate 100 and the semiconductor channel 110, each first line 120 is in contact with the first doped regions 111 arranged along the first direction X; a plurality of lines along the second direction Y The first word lines 130 extending and spaced along the first direction X, the first word lines 130 surround the channel region 112; the gate conductive layer 140, the gate conductive layer 140 is in contact with the second doped region 113, and is located in the first side of the second doped region 113 away from the channel region 112; the channel layer 150, the channel layer 150 is arranged around the outer side of the gate conductive layer 140; the first semiconductor doped layer 160 and the second semiconductor doped layer 170, the first A semiconductor doped layer 160 and a second semiconductor doped layer 170 are disposed on the outer side of the channel region 112, and the first semiconductor doped layer 160 and the second semiconductor doped layer 170 are spaced apart. The first semiconductor doped layer 160, the second semiconductor doped layer 170, the channel layer 150 and the gate conductive layer 140 are used to form the second transistor; the second bit line 180, the second bit line 180 and the first semiconductor doped layer 160 or the second semiconductor doped layer. One of the layers 170 is electrically connected; the second word line 190 is electrically connected to the other of the first semiconductor doped layer 160 or the second semiconductor doped layer 170.

By setting the first doped region 111 of the semiconductor channel 110 as one of the source or drain of the first transistor, the channel region 112 as the channel of the first transistor, and the second doped region 113 as the source of the first transistor the other of the source electrode or the drain electrode, the first word line 130 surrounding the channel region 112 serves as the gate of the first transistor, and the first word line 120 is in contact with the first doped region 111, so that the first word line 130 is in contact with the first doped region 111. 130 controls that when the first transistor is turned on, the first bit line 120 can transfer charges to the second doped region 113, and then transfer the charges to the gate conductive layer 140, which serves as the gate of the second transistor, and the channel layer 150 as the channel of the second transistor, the first semiconductor doped layer 160 and the second semiconductor doped layer 170 serve as the source and drain of the second transistor, and the gate of the second transistor can be determined through the second bit line 180 and the second word line 190 Whether the poles store charge or not, so that the signal stored in the semiconductor structure can be read out.

In some embodiments, the material type of the substrate 100 may be an elemental semiconductor material or a crystalline inorganic compound semiconductor material. The elemental semiconductor material may be silicon or germanium; the crystalline inorganic compound semiconductor material may be silicon carbide, silicon germanium, gallium arsenide or indium gallium, and the like. In addition, doping can also be performed in the substrate 100.

Further, if the substrate 100, the first bit line 120 and the semiconductor channel 110 have the same semiconductor element, the semiconductor channel 110 and the first bit line 120 can be formed using the same film layer structure, and the film layer structure is composed of semiconductor elements, so that the semiconductor the channel 110 and the first bit line 120 have an integral structure, thereby improving the interface state defect between the semiconductor channel 110 and the first bit line 120 and improving the performance of the semiconductor structure.

The semiconductor element may include at least one of silicon, carbon, germanium, arsenic, gallium, and indium. In one example, both the first bit line 120 and the semiconductor channel 110 include silicon. In other examples, both the bit line and the semiconductor channel may include germanium, or both the bit line and the semiconductor channel may include silicon and germanium, or both the bit line and the semiconductor channel may include silicon and carbon, or the bit line Both the semiconductor channel and the bit line include arsenic and gallium, or both the bit line and the semiconductor channel include gallium and indium.

Specifically, the material of the first bit line 120 includes a metal-semiconductor compound, and the metal-semiconductor compound has a relatively small resistivity compared with the unmetallized semiconductor material. Therefore, compared with the semiconductor channel 110, the first resistivity of the bit line 120 is smaller, which is beneficial to reduce the resistance of the first bit line 120 and the contact resistance between the first bit line 120 and the first doped region 111, thereby further improving the electrical performance of the semiconductor structure. In addition, the resistivity of the first bit line 120 is also smaller than that of the substrate 100.

In some embodiments, the first bit line 120 may be partially made of a metal-semiconductor compound, for example, the material of a part of the first line 120 not covered by the first doped region 111 may be made of a metal-semiconductor compound; In other embodiments, the entire material of the first line 120 may also be a metal-semiconductor compound.

In some embodiments, the first bit lines 120 may be in contact with the first doped regions 111 arranged along the first direction X. Taking the illustration as an example, the first bit lines 120 are arranged along the first direction X in the figure. The four first doped regions 111 of the cloth are in contact, that is, charges can be delivered to the four second transistors through one first bit line 120. The above-mentioned corresponding relationship of the quantities is only for illustration, and can be adjusted according to the actual situation.

In some embodiments, the device formed by the semiconductor channel 110 is a junctionless transistor (Junctionless Transistor), that is, the types of doping ions in the first doped region 111, the channel region 112 and the second doped region 113 are the same, for example, the doping ions are all N-type ions, and further, the doping ions in the first doped region 111, the channel region 112 and the second doped region 113 may be the same. Wherein, "junctionless" here refers to no PN junction, that is, there is no PN junction in the transistor formed by the semiconductor channel 110, that is, the doping in the first doped region 111, the channel region 112 and the second doped region 113 The doping concentration of the doped ions is the same, and the advantages of this include: on the one hand, there is no need to perform additional doping on the first doped region 111 and the second doped region 113, thereby avoiding the need for doping the first doped region 111 and the second doped region 113. The problem that the doping process of the doped region 113 is difficult to control, especially as the transistor size is further reduced, if the first doped region 111 and the second doped region 113 are additionally doped, the doping concentration will be more difficult to control; On the one hand, since the device is a junctionless transistor, it is beneficial to avoid the phenomenon of ultra-steep source-drain concentration gradient doping process and the formation of ultra-steep PN junctions in the nanoscale range, thus avoiding the threshold voltage drift and Problems such as the increase of leakage current are also beneficial to suppress the short channel effect, and it can still work in the scale of several nanometers, thus helping to further improve the integration density and electrical performance of the semiconductor structure. It can be understood that the additional doping here refers to the doping to make the doping ion type of the first doped region 111 and the second doped region 113 different from the doping ion type of the channel region 112. miscellaneous.

In some embodiments, the first word line 130 surrounds the channel region 112, and the ability of the first word line 130 to control the first transistor can be increased by the first word line 130 surrounding the channel region 112, and the first word line 130 can increase the ability of the first word line 130 to control the first transistor. The first transistor is controlled to be turned on, that is, the first transistor is selected to be turned on through the first word line 130, the charge is transferred or transferred to the second transistor through the first bit line 120, and the first word line 130 and the first bit lines 120 cooperate with each other to complete the writing process of the semiconductor structure.

In some embodiments, the semiconductor structure further includes: a first insulating layer 200 filled between the semiconductor channels 110 to isolate the semiconductor channels 110.

In some embodiments, the material of the first insulating layer 200 may be silicon oxide, silicon nitride, etc., which may be used as a shallow trench isolation (STI) for the semiconductor structure.

In some embodiments, the semiconductor structure further includes: a second insulating layer 210, the second insulating layer 210 is located between the adjacent first word lines 130, and can be used to isolate the adjacent first word lines 130, thereby The insulation performance between adjacent first word lines 130 can be improved, and the mutual contact between adjacent first word lines 130 can be avoided, and the second insulating layer 210 can also cover at least part of the top surface of the first word lines 130, so that the first word line 130 can also be protected, so that the reliability of the semiconductor structure can be improved.

In some embodiments, the material of the second insulating layer 210 may be an insulating material such as silicon nitride.

In some embodiments, the semiconductor structure may further include: a second gate dielectric layer 220, the second gate dielectric layer 220 is located between the first word line 130 and the channel region 112, and serves as a gate dielectric layer of the first transistor, thereby The carriers of the semiconductor channel 110 are prevented from directly flowing into the first word line 130.

In some embodiments, the second gate dielectric layer 220 may be a material such as silicon oxide or germanium oxide.

In some embodiments, the gate conductive layer 140 is located on the top surface of the semiconductor channel 110 and is in contact with the second doped region 113, so as to receive carriers from the semiconductor channel 110, and the gate conductive layer 140 can serve as a second transistor the gate of, realizes the storage of charges of the semiconductor structure, and is used to determine whether the second transistor is turned on, and then determines whether the level state corresponding to the second transistor is "1" or "0".

In some embodiments, the gate conductive layer 140 and the semiconductor channel 110 may have a one-piece structure, and the one-piece structure here refers to forming the gate conductive layer 140 in the same process step of forming the semiconductor channel 110, that is to say, the semiconductor channel 110 is formed with the semiconductor channel 110. The gate conductive layer 140 is formed from the same initial film layer through various process steps. By setting the gate conductive layer 140 and the semiconductor channel 110 in an integrated structure, the tightness of the connection between the gate conductive layer 140 and the semiconductor channel 110 can be improved, and the gate conductive layer can be improved. The electrical conductivity between 140 and the semiconductor channel 110 can improve the interface state between the gate conductive layer 140 and the semiconductor channel 110, which can improve the performance of the semiconductor structure.

In other embodiments, the structure between the gate conductive layer 140 and the semiconductor channel 110 may not be an integral structure, the gate conductive layer 140 may be formed according to actual requirements, and the shape of the gate conductive layer 140 may be adjusted as required, material properties, etc.

In some embodiments, in the first direction X, the width of the gate conductive layer 140 is smaller than the width of the semiconductor channel 110 of the second doped region 113, that is, the projection of the gate conductive layer 140 on the substrate 100 is located at the second In the projection of the doped region 113 on the substrate 100, by setting the width of the gate conductive layer 140 to be smaller than the width of the semiconductor channel 110 of the second doped region 113, the spacing between the second transistors can be increased, thereby reducing the adjacent second transistors. Parasitic capacitance between transistors.

In some embodiments, the shape of the gate conductive layer 140 is a cube shape, and the width of the gate conductive layer 140 is the distance between two sides of the cube spaced along the first direction X. In some embodiments, the gate conductive layer the shape of the semiconductor channel 140 is a cylinder, and the width of the gate conductive layer 140 is the diameter of the cross section of the cylinder along the first direction. Similarly, the semiconductor channel 110 is in the shape of a cube, and the width of the semiconductor channel 110 is that the cubes are spaced along the first direction X. The distance between the two side surfaces of the semiconductor channel 110 is cylindrical, and the width of the semiconductor channel 110 is the diameter of the cross section of the cylinder along the first direction. In other embodiments, the gate conductive layer and the semiconductor channel may also have other shapes, and the width of the gate conductive layer may be the longest distance in the first direction X of the projection pattern of the gate conductive layer on the substrate.

In some embodiments, the material of the gate conductive layer 140 may be a material such as silicon or germanium.

In some embodiments, the channel layer 150 surrounds the outer surface of the gate conductive layer 140, and the channel layer 150 is also located on the top surface of the second insulating layer 210. Taking the gate conductive layer 140 as an example of a cube type, the channel layer 150. The four side surfaces of the gate conductive layer 140 and the top surface of the second insulating layer 210 between adjacent gate conductive layers 140 are covered, and the channel layer 150 covering the top surface of the second insulating layer 210 is used for connecting with the first semiconductor doped layer. 160 and the second semiconductor doped layer 170 are in contact and electrically connected; in other embodiments, the channel layer 150 can also only surround the outer side of the gate conductive layer 140, at this time, the first semiconductor doped layer 160 and the second semiconductor the doped layer 170 needs to be in contact with the channel layer 150 by other means; in other embodiments, the channel layer surrounds the outer side of the gate conductive layer and covers part of the top surface of the second insulating layer, and only needs to realize the channel layer It can be electrically connected to the first semiconductor doped layer and the second semiconductor doped layer.

In some embodiments, the thickness of the channel layer 150 may be 3-10 nm, such as 5 nm, 7 nm, etc. It can be understood that by setting the thickness of the channel layer 150 to be 3-10 nm, the second transistor can have a better performance, when the thickness of the channel layer 150 is less than 3 nm, the thickness of the channel of the second transistor is low, and electrical breakdown is likely to occur, resulting in low reliability of the second transistor, when the thickness of the channel layer 150 is greater than 10 nm, as the thickness of the channel of the second transistor is thicker, resulting in a decrease in the performance of the second transistor.

In some embodiments, the material of the channel layer 150 may be polysilicon with P-type doping.

In some embodiments, the first semiconductor doped layer 160 may serve as one of the source electrode or the drain electrode of the second transistor, and the second semiconductor doped layer 170 may serve as the other one of the source electrode or the drain electrode of the second transistor. One, taking the first semiconductor doped layer 160 as the source and the second semiconductor doped layer 170 as the drain as an example, the first semiconductor doped layer 160, the second semiconductor doped layer 170, the channel layer 150 and the gate conductive layer the layer 140 constitutes the source, drain, channel and gate of the second transistor respectively. When the gate conductive layer 140 stores charges, the second transistor can be controlled to turn on. The first semiconductor doped layer 160 and the second semiconductor doped layer 140 Carriers flow between the layers 170 through the channel layer 150.

It can be understood that, both the first semiconductor doped layer 160 and the second semiconductor doped layer 170 are electrically connected to the channel layer 150, so as to realize the flow of carriers of the second transistor.

In some embodiments, the first semiconductor doped layers 160 are arranged along the first direction X, and two adjacent gate conductive layers 140 in the first direction X are connected to the same first semiconductor doped layer 160, so that the first semiconductor doped layer 160 is used as an example of the source, that is to say, the two second transistors arranged along the first direction X share the source, and the gate conductive layer 140 arranged in the first direction X is adjacent to the same first connection of the semiconductor doped layer 160 can reduce the process steps for forming the semiconductor structure, and can improve the integration degree of the semiconductor structure.

In some embodiments, the second semiconductor doped layers 170 are arranged along the second direction Y, and the adjacent gate conductive layers 140 in the second direction Y are connected to the same second semiconductor doped layer 170, and the second semiconductor doped layers 170 are doped with the second semiconductor. The doped layer 170 is used as an example of the drain, that is to say, the second transistors arranged along the second direction Y share the drain, and the adjacent gate conductive layer 140 arranged in the second direction Y and the same second semiconductor doped layer the 170 connection can reduce the process steps for forming the semiconductor structure, and can improve the integration degree of the semiconductor structure.

In some embodiments, the material of the first semiconductor doped layer 160 and the second semiconductor doped layer 170 may be polysilicon material with N-type doping.

In some embodiments, the channel layer 150 includes: a flat portion 151 and a protruding portion 152, the protruding portion 152 surrounds the gate conductive layer 140, the flat portion 151 is connected to the protruding portion 152, and the first semiconductor doped layer 160 is disposed on the outer side surface of the protruding portion 152 arranged along one of the first direction X or the second direction Y is in contact with the top surface of the flat portion 151, and the second semiconductor doped layer 170 is disposed on the protruding portion 152 along the first direction. The outer side surface of the other one of the X or the second direction Y is arranged in contact with the top surface of the flat portion 151. The flat portion 151 of the channel layer 150 may be the channel layer 150 between adjacent gate conductive layers 140, corresponding to the illustration, that is, the part of the channel layer 150 covering the surface of the second insulating layer 210, the channel layer 150. The protruding portion 152 is the part of the channel layer 150 located on the sidewall of the gate conductive layer 140 and on the top surface of the gate conductive layer 140. By setting the flat portion 151, the channel layer 150 and the first semiconductor doped layer 160 and the second semiconductor doped layer 170 is connected in contact, and the channel length of the second transistor can be increased by providing the protruding portion 152, thereby improving the control ability of the gate conductive layer 140 as a gate and improving the performance of the second transistor.

In some embodiments, the channel layer 150 is doped with first dopant ions, the first semiconductor dopant layer 160 is doped with second dopant ions, the ion type of the first dopant ion and the ion type of the second dopant ion different. The ion type of the first doping ions can be P-type ions, and the ion type of the second doping ions can be N-type ions. By setting the doping ions of the channel layer 150 and the first semiconductor doped layer 160 to be different, a PN is formed. junction to form a second transistor.

In some embodiments, the dopant ion type of the second semiconductor doped layer 170 is the same as that of the first semiconductor doped layer 160, and the doping concentration is the same.

In some embodiments, the second bit line 180 may extend along the first direction X, and the second bit line 180 is electrically connected with the plurality of first semiconductor doped layers 160 arranged along the first direction X, so that the second bit line 180 may pass through the second bit line 180 detects whether there is current in the first semiconductor doped layer 160, the second word line 190 may extend along the second direction Y, and the second word line 190 may be doped with a plurality of second semiconductors arranged along the second direction Y The doped layer 170 is electrically connected, so that whether there is current in the second semiconductor doped layer 170 can be detected through the second word line 190, and the current level state of the semiconductor structure can be read through the second bit line 180 and the second word line 190.

In some embodiments, the second bit line 180 may be formed by stacking multiple layers, for example, may include a bit line conductive layer and a bit line protection layer, the signal transmission is performed through the bit line conductive layer, and the bit line protection layer is used for protection A bit line conductive layer, wherein the bit line conductive layer can also be formed by stacking multiple layers, for example, it can include: a first bit line conductive layer and a second bit line conductive layer, wherein the material of the first bit line conductive layer can be is a semiconductor material, and the material of the second bit line conductive layer may be a metal material. It should be noted that the specific structure of the second bit line 180 may be set according to actual requirements; in other embodiments, the second bit line 180 may also be a single-layer film.

In some embodiments, the second word line 190 may be formed by stacking multiple film layers, for example, may include a word line conductive layer and a word line protection layer. Signal transmission is performed through the word line conductive layer, and the word line protection layer is used for protection. The word line conductive layer, wherein the word line conductive layer can also be formed by stacking multiple layers, for example, it can include: a first word line conductive layer and a second word line conductive layer, wherein the material of the first word line conductive layer can be the semiconductor material, and the material of the second word line conductive layer may be a metal material. It should be noted that the specific structure of the second word line 190 may be set according to actual requirements; in other embodiments, the second word line 190 may also be a single-layer film.

In some embodiments, the semiconductor structure may further include: a first gate dielectric layer 230, the first gate dielectric layer 230 surrounds the surface of the gate conductive layer 140 and is in contact with the gate conductive layer 140; the first gate dielectric layer 230 may serve as the first gate dielectric layer 230. The gate dielectric layer of the second transistor can avoid the source of the second transistor.

In some embodiments, the first gate dielectric layer 230 may be a material such as silicon oxide used as the gate dielectric layer.

In some embodiments, the channel layer 150 surrounds the surface of the first gate dielectric layer 230 and is in contact with the first gate dielectric layer 230, that is, a first gate is spaced between the channel layer 150 and the gate conductive layer 140 Dielectric layer 230.

In some embodiments, the semiconductor structure further includes: a first isolation layer 240, the first isolation layer 240 surrounds a part of the surface of the channel layer 150 and is in contact with the channel layer 150, and the first isolation layer 240 can be used for isolation by disposing the first isolation layer 240. The adjacent first semiconductor doped layer 160 and the second semiconductor doped layer 170 can avoid direct contact between the adjacent first semiconductor doped layer 160 and the second semiconductor doped layer 170, thereby improving the reliability of the semiconductor structure sex.

In some embodiments, it further includes: a second isolation layer 250, the second isolation layer 250 is located between the adjacent first semiconductor doped layer 160 and the adjacent second semiconductor doped layer 170, and the second isolation layer 250 passes through the second isolation layer 250. The adjacent first semiconductor doped layer 160 and the adjacent second semiconductor doped layer 170 can be isolated, so that direct contact between the first semiconductor doped layer 160 and the second semiconductor doped layer 170 can be avoided, and the semiconductor layer can be improved. structural reliability.

It can be understood that, the first semiconductor doped layer 160 and the second semiconductor doped layer 170 can be isolated by the first isolation layer 240 and the second isolating layer 250, so that the first semiconductor doped layer 160 and the second semiconductor doped layer 160 are doped layer 170 in contact with the channel layer 150 through the flat portion 151 of the channel layer 150, so that the adjacent first semiconductor doped layer 160 and the second semiconductor doped layer 170 can be isolated, and the first semiconductor doped layer 170 can be isolated. The doped layer 160 and the second semiconductor doped layer 170 are in contact with the channel layer 150.

In some embodiments, the materials of the first isolation layer 240 and the second isolation layer 250 may be different, and process production may be facilitated by setting the materials of the first isolation layer 240 and the second isolation layer 250 to be different. In other embodiments, the materials of the first isolation layer 240 and the second isolation layer 250 may also be the same, and the materials of the first isolation layer 240 and the second isolation layer 250 may be adjusted according to actual requirements.

In some embodiments, the material of the first isolation layer 240 may be silicon oxide. By setting the material of the first isolation layer 240 to be silicon oxide, it may be directly formed by oxidizing part of the gate conductive layer 140, which may facilitate process production.

In some embodiments, the material of the second isolation layer 250 may be silicon nitride. By setting the material of the second isolation layer 250 to be silicon nitride, the adjacent first semiconductor doped layer 160 and the second semiconductor doped layer may be improved. Insulation properties between 170.

In some embodiments, the semiconductor structure further includes: a protective layer 260, the protective layer 260 covers the top surface of the channel layer 150, a part of the surface of the first semiconductor doped layer 160 and a part of the surface of the second semiconductor doped layer 170;

the two bit lines 180 penetrate through the protective layer 260 to be in contact with one of the first semiconductor doped layer 160 or the second semiconductor doped layer 170, and the second word lines 190 penetrate the protective layer 260 and the first semiconductor doped layer 160 or the first semiconductor doped layer 160 or the second word line 190. The other one of the two semiconductor doped layers 170 is in contact and connected. Taking the connection between the second bit line 180 and the first semiconductor doped layer 160 as an example, the second bit line 180 and the second semiconductor doped layer can be doped by disposing the protective layer 260. The layer 170 is separated, so that the connection between the second bit line 180 and the second semiconductor doped layer 170 can be avoided. Similarly, the second word line 190 can be separated from the first semiconductor doped layer 160 by disposing the protective layer 260. Therefore, the electrical connection between the second word line 190 and the first semiconductor doped layer 160 can be avoided.

In some embodiments, the material of the protective layer 260 may be an insulating material such as silicon oxide.

In some embodiments, the semiconductor structure may further include a conductive plug 280, the conductive plug 280 penetrates through the protective layer 260, and the second bit line 180 may be doped with the first semiconductor doped layer 160 or the second semiconductor doped layer through the conductive plug 280 One of the layers 170 is electrically connected, and the second word line 190 may be electrically connected to the other of the first semiconductor doped layer 160 or the second semiconductor doped layer 170 through the conductive plug 280.

In some embodiments, the semiconductor structure may further include: a third insulating layer 270, the third insulating layer 270 covers the top surface and sidewalls of the second bit lines 180, and the second bit lines 180 can be separated by disposing the third insulating layer 270. The second word line 190 is isolated from the second word line 190 so as to avoid electrical connection between the second bit line 180 and the second word line 190, and the third insulating layer 270 can also provide a support foundation for forming the second word line 190.

In some embodiments, the material of the third insulating layer 270 may be an insulating material such as silicon oxide, silicon nitride, or silicon oxynitride.

It should be noted that the materials mentioned in the embodiments of the present disclosure are all examples, and do not limit the material of the film layer. Materials with the same other properties that can meet the purposes of the embodiments of the present disclosure can also be used.

The embodiments of the present disclosure provide a semiconductor structure by setting the first doped region 111 of the semiconductor channel 110 as one of the source electrode or the drain electrode of the first transistor, and the channel region 112 as the channel of the first transistor, The second doped region 113 serves as the other of the source or drain of the first transistor, the first word line 130 surrounding the channel region 112 serves as the gate of the first transistor, the first bit line 120 is connected to the first doped region 111 is in contact, so that when the first word line 130 controls the first transistor to be turned on, the first bit line 120 can transfer charges to the second doped region 113, and then transfer the charges to the gate conductive layer 140, which serves as the gate conductive layer 140. The gate of the second transistor, the channel layer 150 is used as the channel of the second transistor, the first semiconductor doped layer 160 and the second semiconductor doped layer 170 are used as the source and drain of the second transistor, and the second bit line 180 and the second word line 190 can determine whether the gate of the second transistor has stored charges, so that the signal stored in the semiconductor structure can be read out.

Another embodiment of the present disclosure further provides a method for fabricating a semiconductor structure, which can be used to form the above-mentioned semiconductor structure. The following will describe the method for fabricating the semiconductor structure provided by another embodiment of the present disclosure with reference to the accompanying drawings. It should be noted that the aforementioned For the same or corresponding parts of the embodiments, reference may be made to the corresponding descriptions of the foregoing embodiments, which will not be repeated below.

FIGS. 5 to 21 and 2 to 4 are schematic structural diagrams corresponding to each step of the method for fabricating the semiconductor structure according to another embodiment of the present disclosure. FIGS. 6 to 14 and FIG. 4 are cross-sectional views along the dashed line in FIG. 5, and FIGS. 15, 18 to 21 and FIG. 2 are top views of the semiconductor structure, and the rest of the pictures are stereoscopic views.

Specifically, a method for fabricating a semiconductor structure provided by an embodiment of the present disclosure includes: providing a substrate 100; forming a plurality of semiconductor channels 110 and a gate conductive layer 140 on the substrate 100 and spaced along the first direction X and the second direction Y, The semiconductor channel 110 includes a first doped region 111, a channel region 112 and a second doped region 113 arranged in sequence along the third direction Z, each semiconductor channel 110 is used to form a first transistor, the gate conductive layer 140 and the second two doped regions 113 are in contact with each other, and are located on the side of the second doped region 113 away from the channel region 112; a plurality of first line 120 extending along the first direction X and spaced along the second direction Y are formed, The first bit lines 120 are located between the substrate 100 and the semiconductor channel 110, and each first bit line 120 is in contact with the first doped regions 111 arranged along the first direction X; a plurality of first doped regions 111 extending along the second direction Y are formed and the first word lines 130 arranged at intervals along the first direction X, the first word lines 130 surround the channel region 112; the channel layer 150 is formed, and the channel layer 150 is arranged around the outer side of the gate conductive layer 140; the first semiconductor doped layer 160 and the second semiconductor doped layer 170 are disposed on the outer side of the channel layer 150, and the first semiconductor doped layer 160 and the second semiconductor doped layer 160. The doped layers 170 are spaced apart, and the first semiconductor doped layer 160, the second semiconductor doped layer 170, the channel layer 150 and the gate conductive layer 140 are used to form a second transistor; a second bit line 180, a second bit line are formed 180 is electrically connected to one of the first semiconductor doped layer 160 or the second semiconductor doped layer 170; a second word line 190 is formed, and the second word line 190 is connected to the first semiconductor doped layer 160 or the second semiconductor doped layer 160. The other of the layers 170 are electrically connected.

By forming the first doped region 111 as one of the source or drain of the first transistor, by forming the channel region 112 as the gate of the first transistor, by forming the second doped region 113 as the source of the first transistor the other doped region 113 as the source of the first transistor the other is the electrode or the drain, and by forming the first bit line 120 in contact with the first doped region 111, it can store charges to the gate of the second transistor when the first transistor is turned on, or the second transistor the charge of the gate is extracted, the conduction of the first transistor is controlled by forming the first word line 130 surrounding the channel region 112, the gate conductive layer 140 is formed as the gate of the second transistor, and the channel layer 150 is formed as the second transistor. For the channel of the transistor, by forming the first semiconductor doped layer 160 and the second semiconductor doped layer 170 as the source and drain of the second transistor, when the gate of the second transistor receives the charge from the first transistor, the second transistor can be controlled. The two transistors are turned on, thereby measuring the second bit line 180 electrically connected to one of the first semiconductor doped layer 160 or the second semiconductor doped layer 170 and the second bit line 180 electrically connected to the first semiconductor doped layer 160 or the second semiconductor the voltage difference between the second word line 190 electrically connected to the other of the doped layers 170, so that the level state corresponding to the transistor corresponding to the second word line 190 and the second bit line 180 can be determined, The manufacturing method of the semiconductor structure provided by the embodiments of the present disclosure can reduce the manufacturing difficulty of the semiconductor structure and improve the integration degree of the semiconductor structure.

Referring to FIGS. 5 to 8, the method for forming the semiconductor channel 110 and the gate conductive layer 140 includes: forming an initial semiconductor channel 114, the initial semiconductor channel 114 is located on the substrate 100 and is spaced along the first direction X and the second direction Y. The initial semiconductor channel 114 includes a first doped region 111, a channel region 112 and a second initial doped region 115 arranged in sequence along the third direction Z; a portion of the second initial doped region 115 is etched to form a second doped region 115 Impurity region 113 and gate conductive layer 140. The spacing between adjacent gate conductive layers 140 can be increased by etching part of the second initial doped regions 115 of the initial semiconductor channel 114, so that the insulation performance between adjacent gate conductive layers 140 can be improved.

Figure 5:
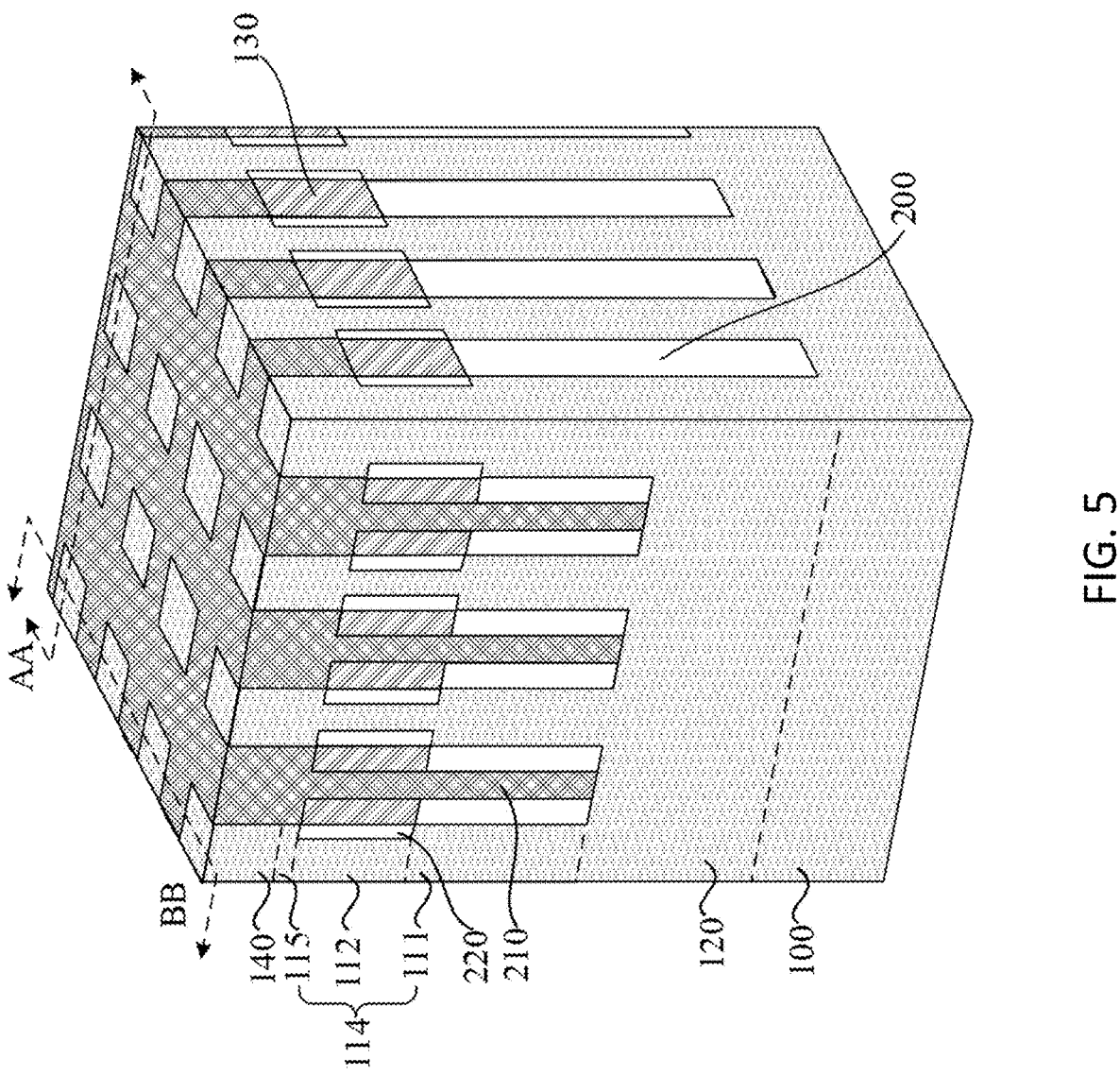
FIGS. 5 to 21 are schematic structural diagrams corresponding to each step of the method for fabricating the semiconductor structure according to another embodiment of the present disclosure.
Figure 6:
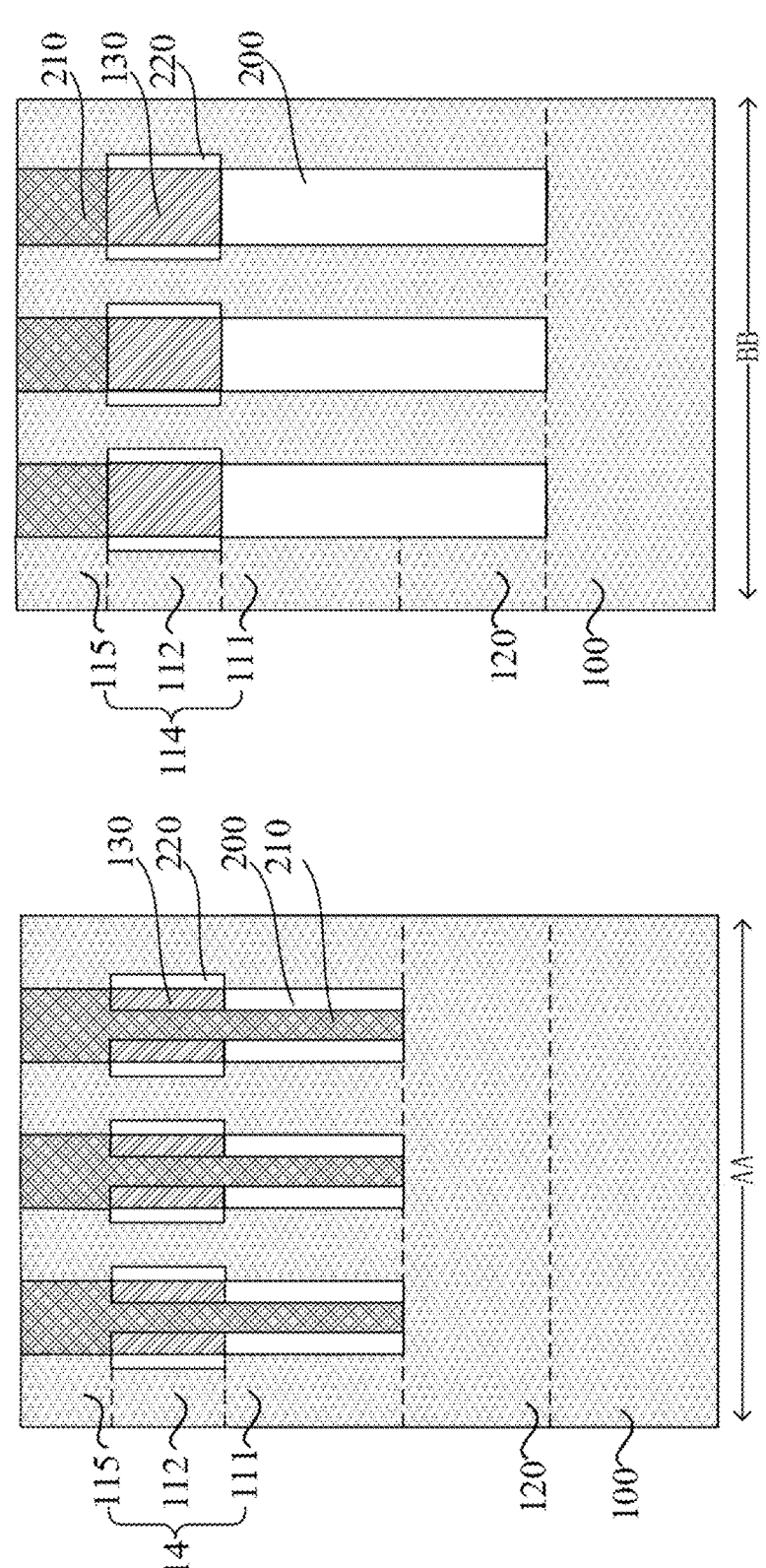

Referring to FIG. 6, FIG. 6 is a cross-sectional view taken along the dashed line in FIG. 5, and the structure shown in FIG. 5 is not subjected to process steps.

Figure 7:
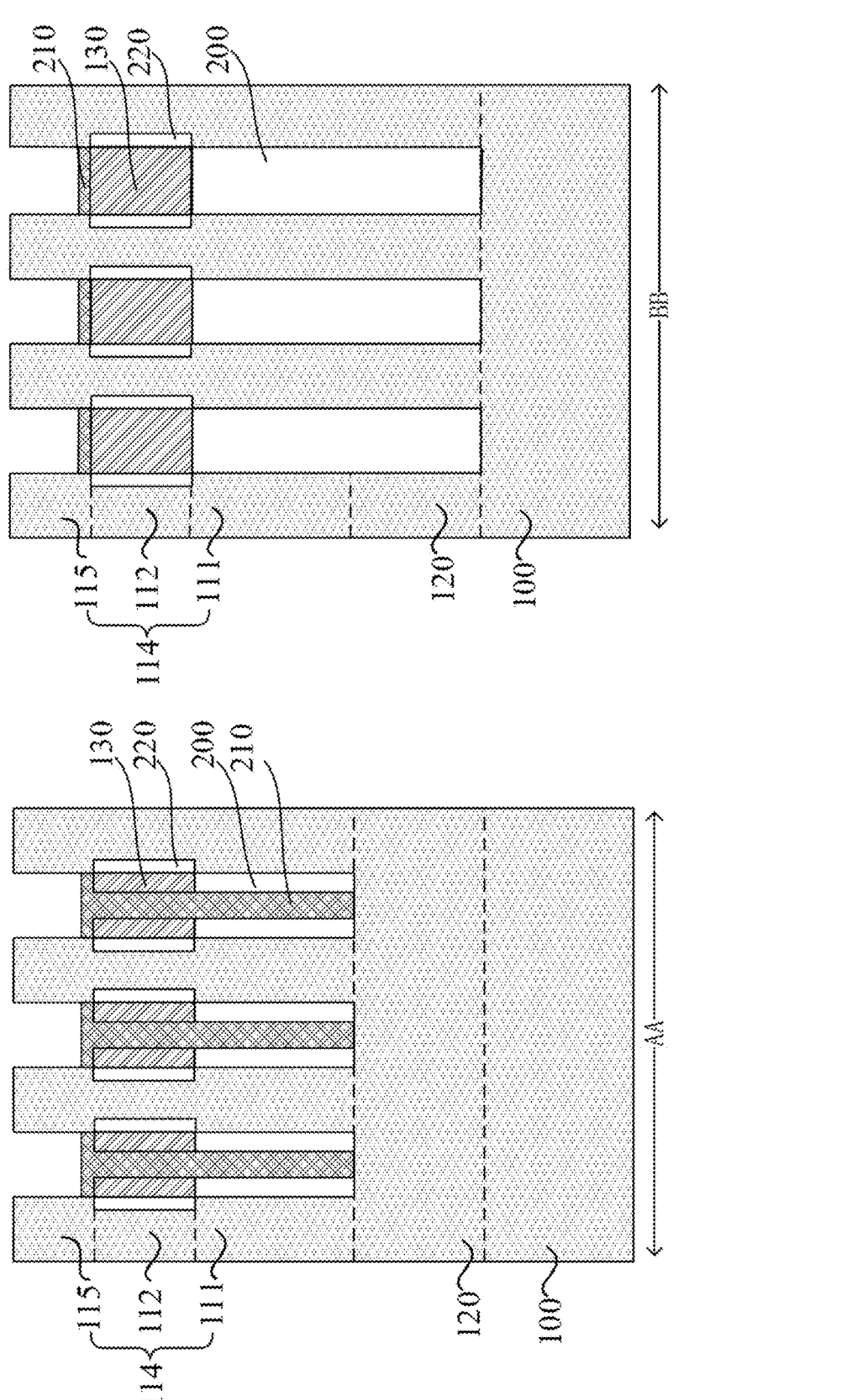

Referring to FIG. 7, in some embodiments, the semiconductor structure further includes: a first insulating layer 200 filled between the initial semiconductor channels 114; a second insulating layer 210, the second insulating layer 210 is located adjacent to Between the first word lines 130; the second gate dielectric layer 220, the second gate dielectric layer 220 is located between the first word lines 130 and the channel region 112, and serves as the gate dielectric layer of the first transistor. The method for forming the semiconductor channel 110 and the gate conductive layer 140 further includes: etching the second insulating layer 210 to expose the top surface and sidewalls of the second initial doped region 115.

Figure 8:
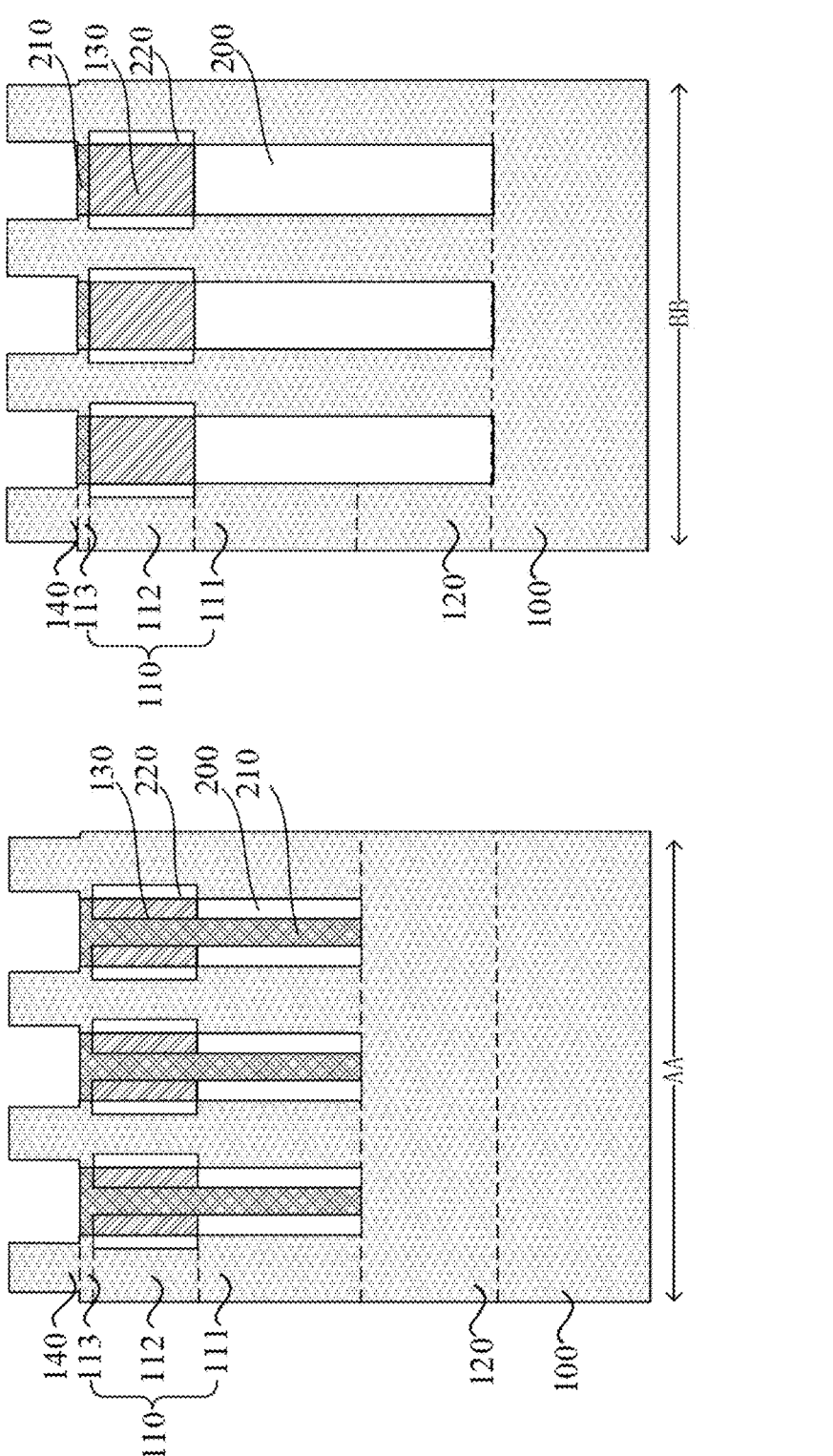

Referring to FIG. 8, the initial semiconductor channel 114 is etched to form the second doped region 113 and the gate conductive layer 140. In some embodiments, the method of etching the initial semiconductor channel 114 may be a wet etching method. In other embodiments, the initial semiconductor channel may also be etched by dry etching or the like.

It can be understood that the above-mentioned formation of the second doped region 113 and the gate conductive layer 140 by etching is an integrated method for forming the semiconductor channel 110 and the gate conductive layer 140. In other embodiments, the second doped region 113 The gate conductive layer 140 can also have a separate structure. The method for forming the second doped region 113 and the gate conductive layer 140 can be to deposit a semiconductor material on the surface of the second doped region 113 to form the gate conductive layer 140.

FIGS. 9 to 12, before forming the channel layer 150, the method further includes: forming a first gate dielectric layer 230, the first gate dielectric layer 230 surrounds the surface of the gate conductive layer 140 and is in contact with the gate conductive layer 140; after forming the channel layer 150, the method further includes: forming a first isolation layer 240. The first isolation layer 240 surrounds the surface of the channel layer 150 and is in contact with the channel layer 150. By forming the first gate dielectric layer 230, it can be used to isolate the gate conductive layer 140 from the channel layer 150, so that direct connection between the gate and the channel of the second transistor can be avoided. Subsequently, the adjacent first semiconductor doped layer 160 and the second semiconductor doped layer 170 are isolated.

Figure 9:
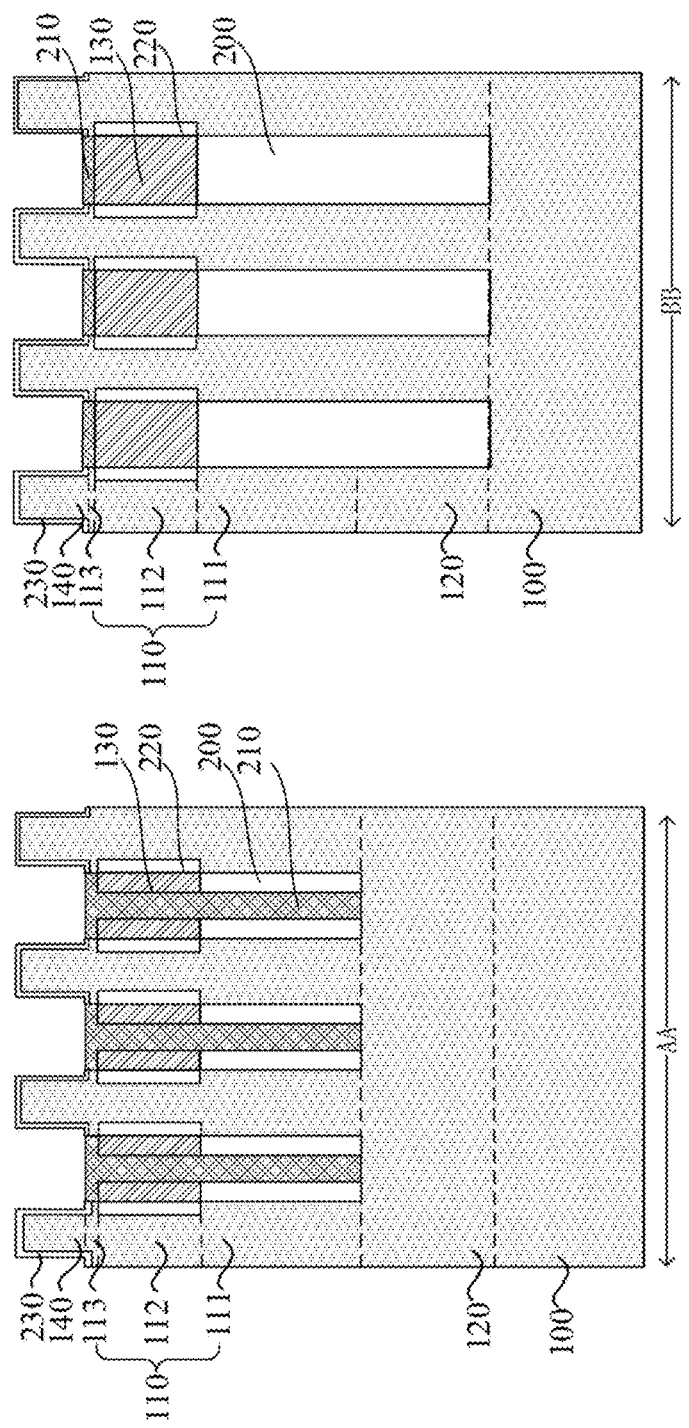

Referring to FIG. 9, in some embodiments, the first gate dielectric layer 230 may be formed by directly oxidizing a part of the gate conductive layer 140, and in other embodiments, the first gate dielectric layer 230 may also be formed by atomic deposition, the density of the first gate dielectric layer 230 formed by oxidation is better, and the performance as a gate dielectric layer is better, and the uniformity of the first gate dielectric layer 230 formed by atomic deposition is better.

Figure 10:
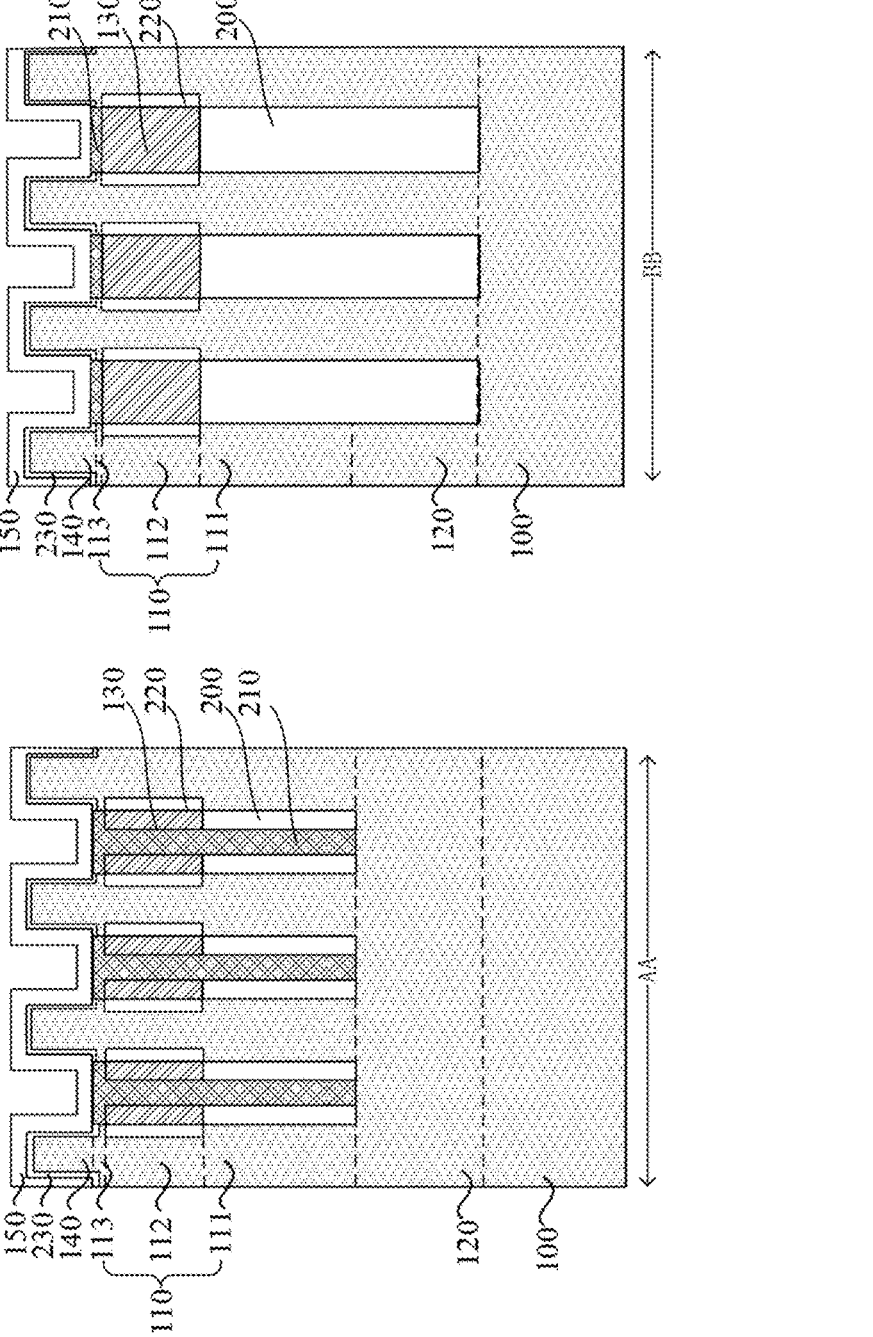

Referring to FIG. 10, a channel layer 150 is formed. In some embodiments, the channel layer 150 covers the surface of the first gate dielectric layer 230, and the channel layer 150 also covers the entire surface of the second insulating layer 210. In other words, In the process of forming the channel layer 150, the entire surface is deposited, that is, the channel layer 150 covers the entire top surface of the semiconductor structure shown in FIG. 9. In other embodiments, the channel layers may also be spaced apart from each other, that is, the channel layers are arranged at intervals along the first direction X and the second direction Y, and a channel layer corresponds to a gate conductive layer.

Figure 11:
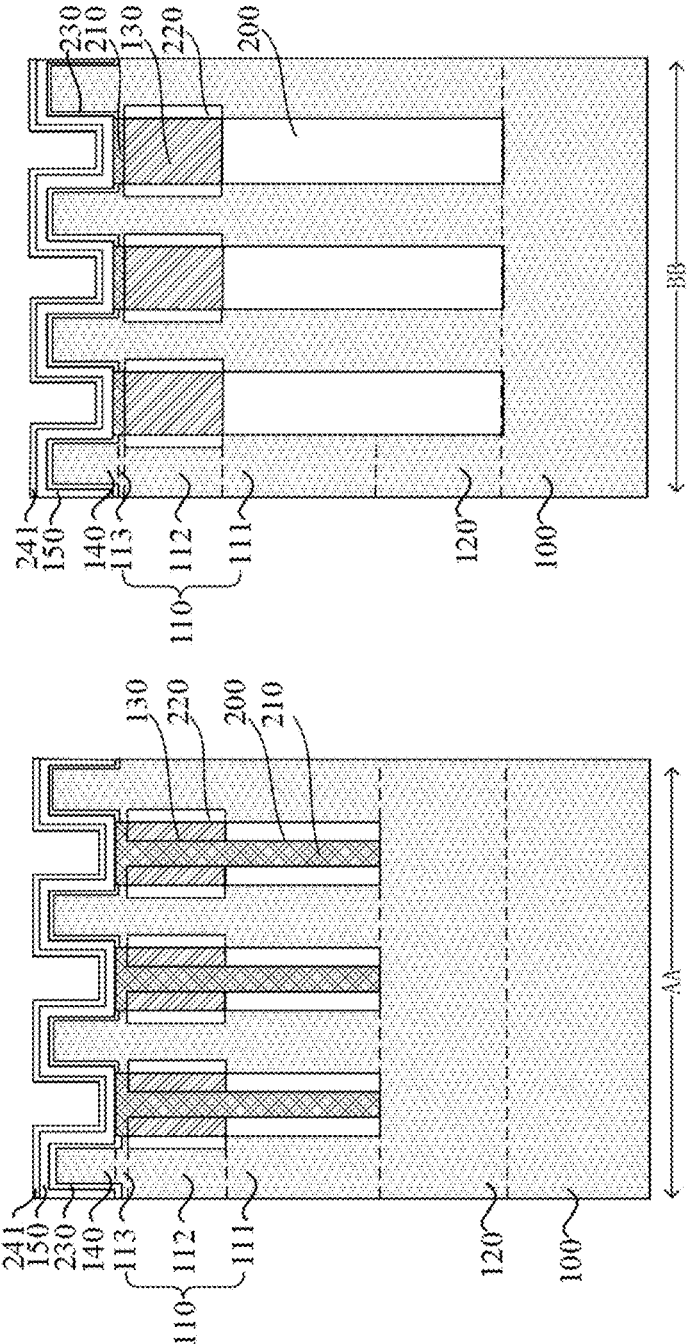
Figure 12:
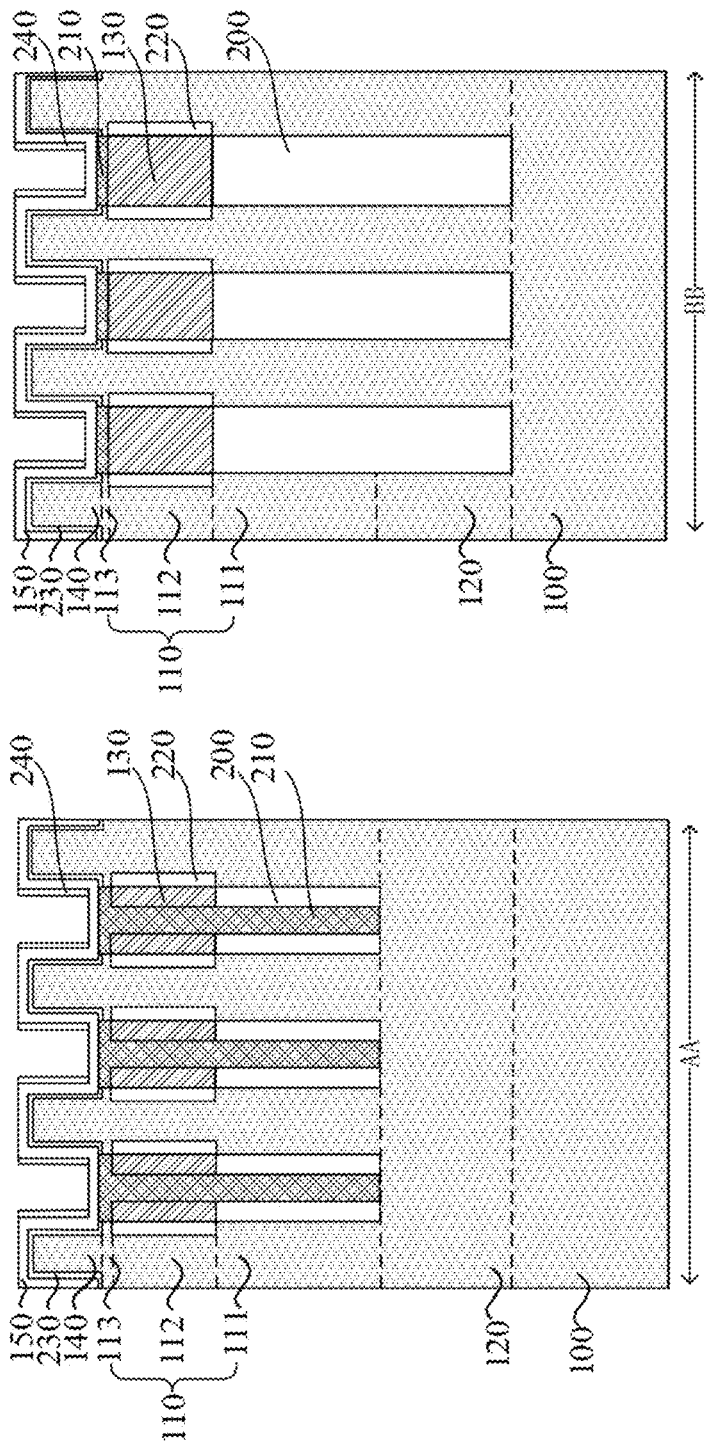

Referring to FIGS. 11 and 12, the channel layer 150 includes a flat portion 151 and a protruding portion 152, the protruding portion 152 surrounds the gate conductive layer 140, and the flat portion 151 is connected to the protruding portion 152. The method for forming the first isolation layer 240 includes: the first initial isolation layer 241 is formed, and the first initial isolation layer 241 covers the entire surface of the channel layer 150; the first initial isolation layer 241 is etched to expose the top surface of the protruding portion 152 and the top surface of the flat portion 151, The first initial isolation layer 241 remains as the first isolation layer 240. The performance of the first isolation layer 240 formed by first forming the first initial isolation layer 241 and then etching to form the first isolation layer 240 is better, and the top surface of the flat portion 151 is exposed by etching to form the subsequent channel layer 150. The contact and connection with the first semiconductor doped layer and the second semiconductor doped layer provide a process basis.

In some embodiments, the first initial isolation layer 241 may be formed by oxidizing the channel layer 150. In other embodiments, the first initial isolation layer 241 may also be formed by atomic deposition. The density of the first initial isolation layer 241 formed by the method is relatively high, and the thickness of the channel layer 150 can also be adjusted. The first initial isolation layer 241 formed by the atomic deposition method has better uniformity.

Referring to FIGS. 13 to 19, in some embodiments, the method for forming the first semiconductor doped layer 160 and the second semiconductor doped layer 170 includes: forming an initial doped layer 161, and the initial doped layer 161 covers the first isolation layer 240 and the surface of the channel layer 150; the initial doped layer 161 is etched to expose the top surface of the first isolation layer 240 and the channel layer 150, and the remaining initial doped layer 161 is used as the doped layer 162; the doped layer is etched 162 to form a groove, the groove exposes part of the sidewall of the first isolation layer 240 and the top surface of the flat portion 151, and the remaining doping layer 162 serves as the first semiconductor doped layer 160 and the second semiconductor doped layer 170. The initial doped layer 161 is first formed by depositing the entire surface first, the top surface of the initial doped layer 161 is higher than the top surface of the channel layer 150, and then the top surface is formed to be flush with the top surface of the channel layer 150 by etching the flat doping layer 162 is formed, and finally the first semiconductor doped layer 160 and the second semiconductor doped layer 170 are formed by etching, so that the adjacent first semiconductor doped layer 160 and the second semiconductor doped layer 170 can be formed. 170 is separated, so as to avoid the direct contact between the adjacent first semiconductor doped layer 160 and the second semiconductor doped layer 170, that is, to avoid the direct connection between the source electrode and the drain electrode of the second transistor.

Figure 13:
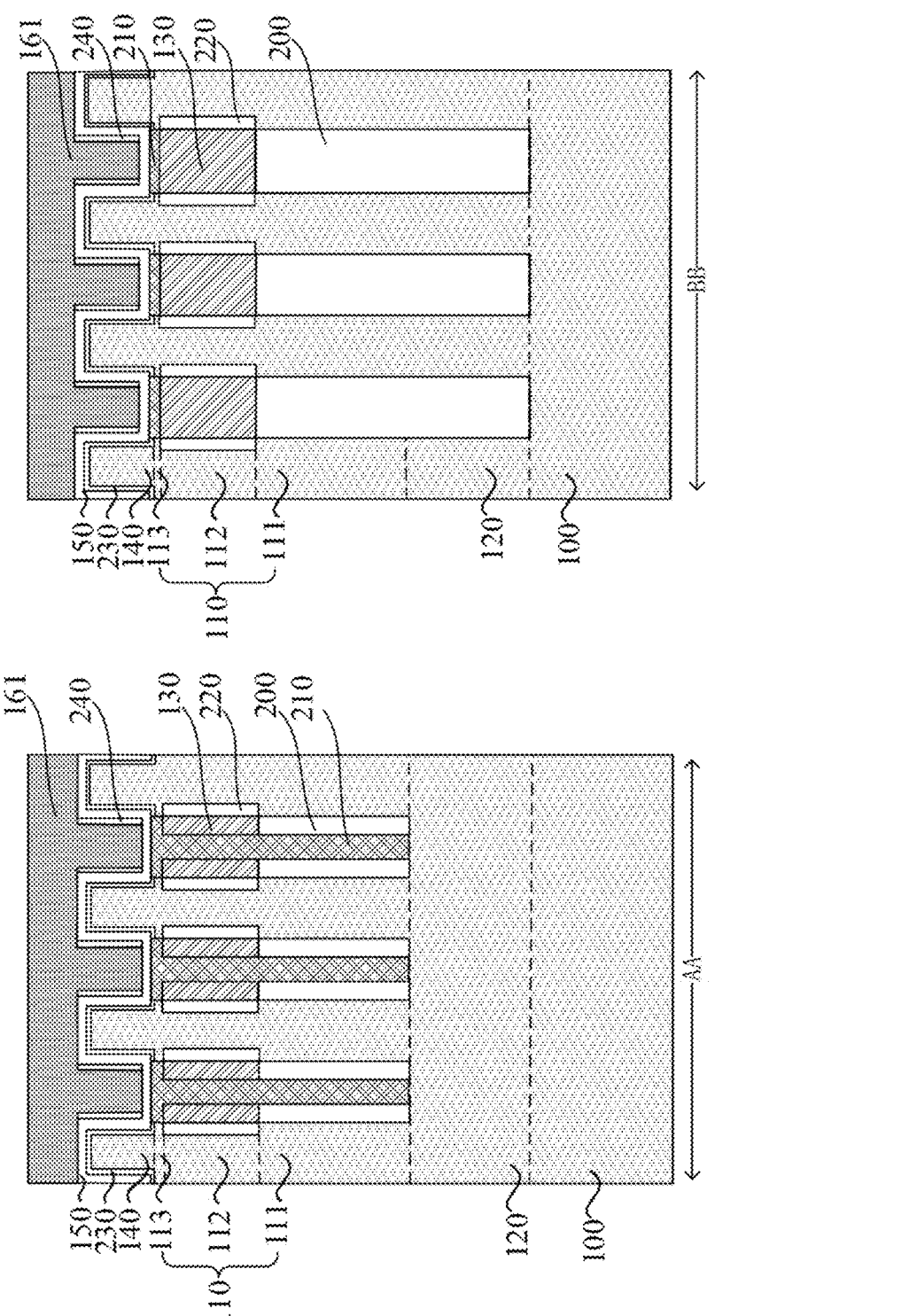

Referring to FIG. 13, the material of the initial doped layer 161 is filled to form the initial doped layer 161.

Figure 14:
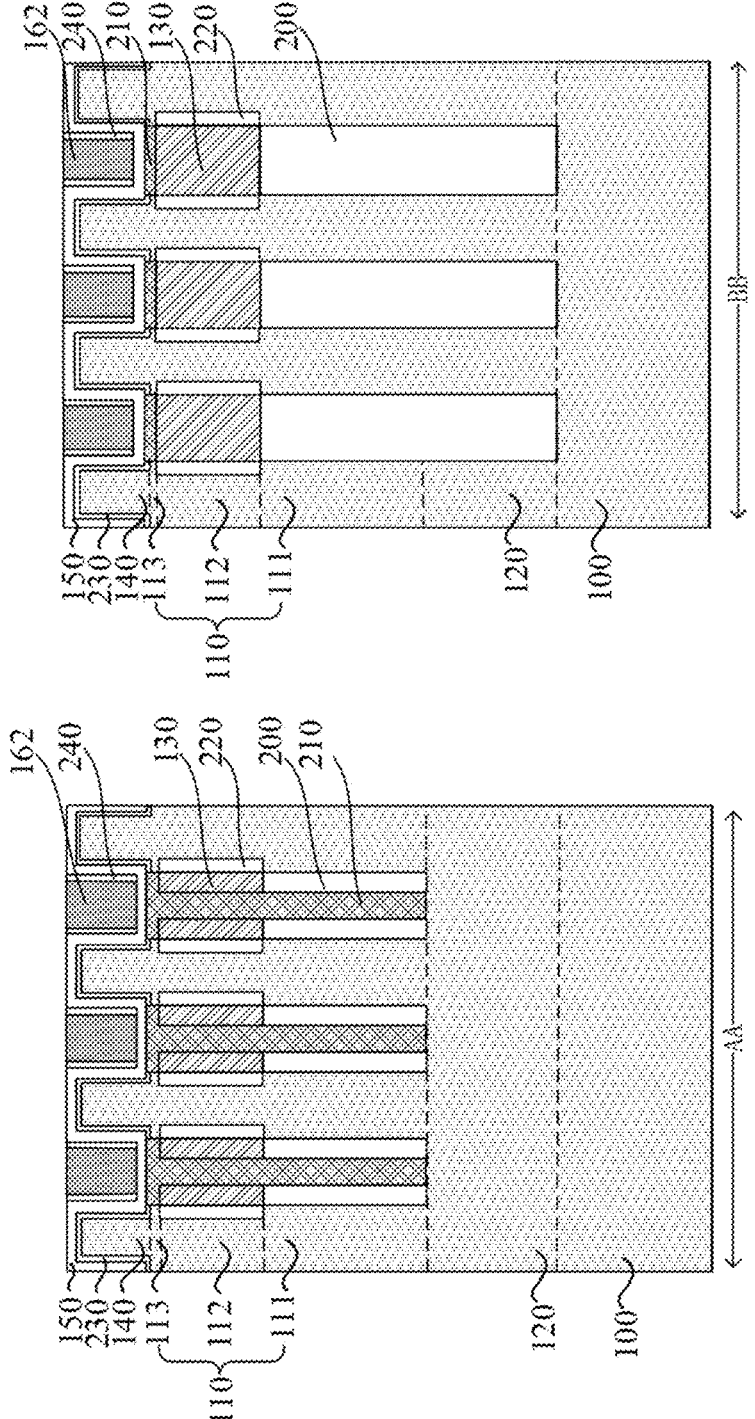

Referring to FIG. 14, the initial doped layer 161 is etched, or a part of the initial doped layer 161 is removed by grinding to form a doping layer 162.

Figure 15:
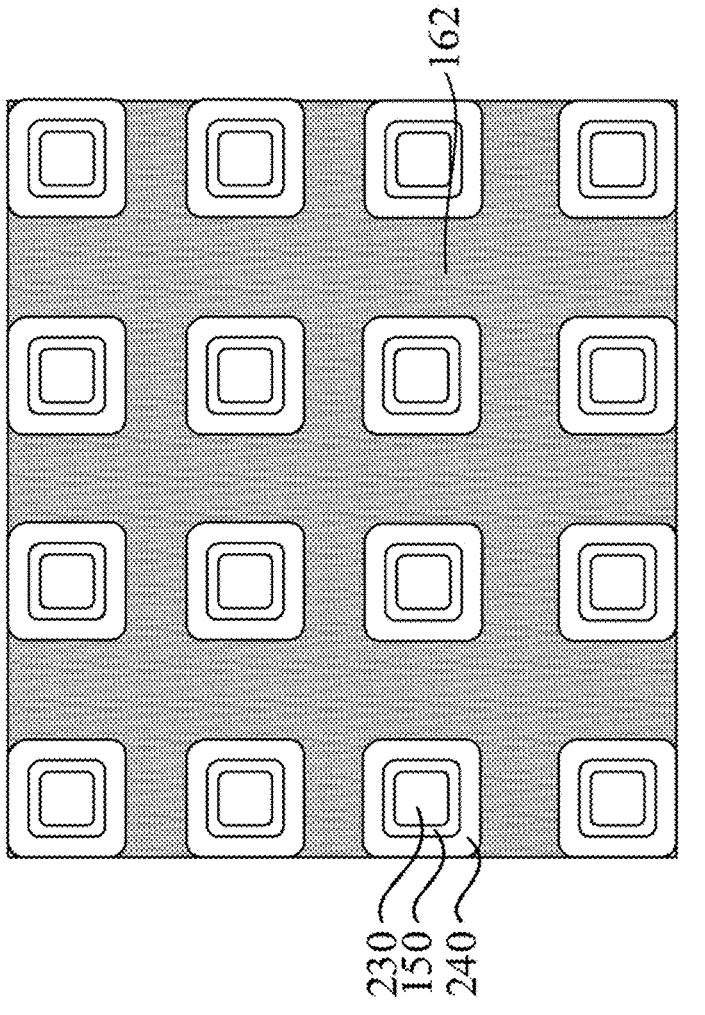
Figure 16:
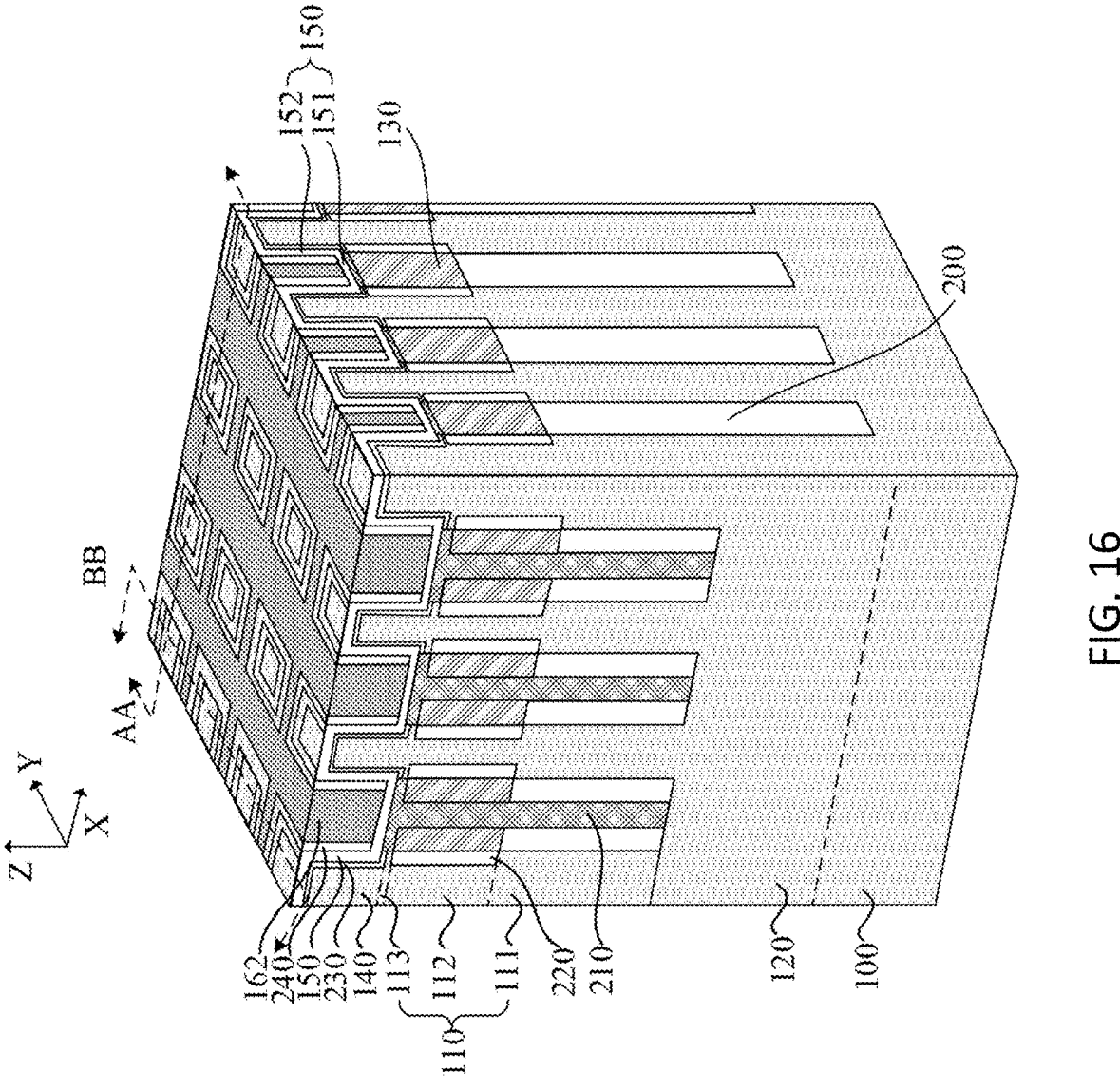

Referring to FIGS. 15 and 16, FIG. 15 is a top view of the semiconductor structure shown in FIG. 14, and FIG. 16 is a perspective view of the semiconductor structure shown in FIG. 14, and no process steps are performed on the semiconductor structure.

Figure 17:
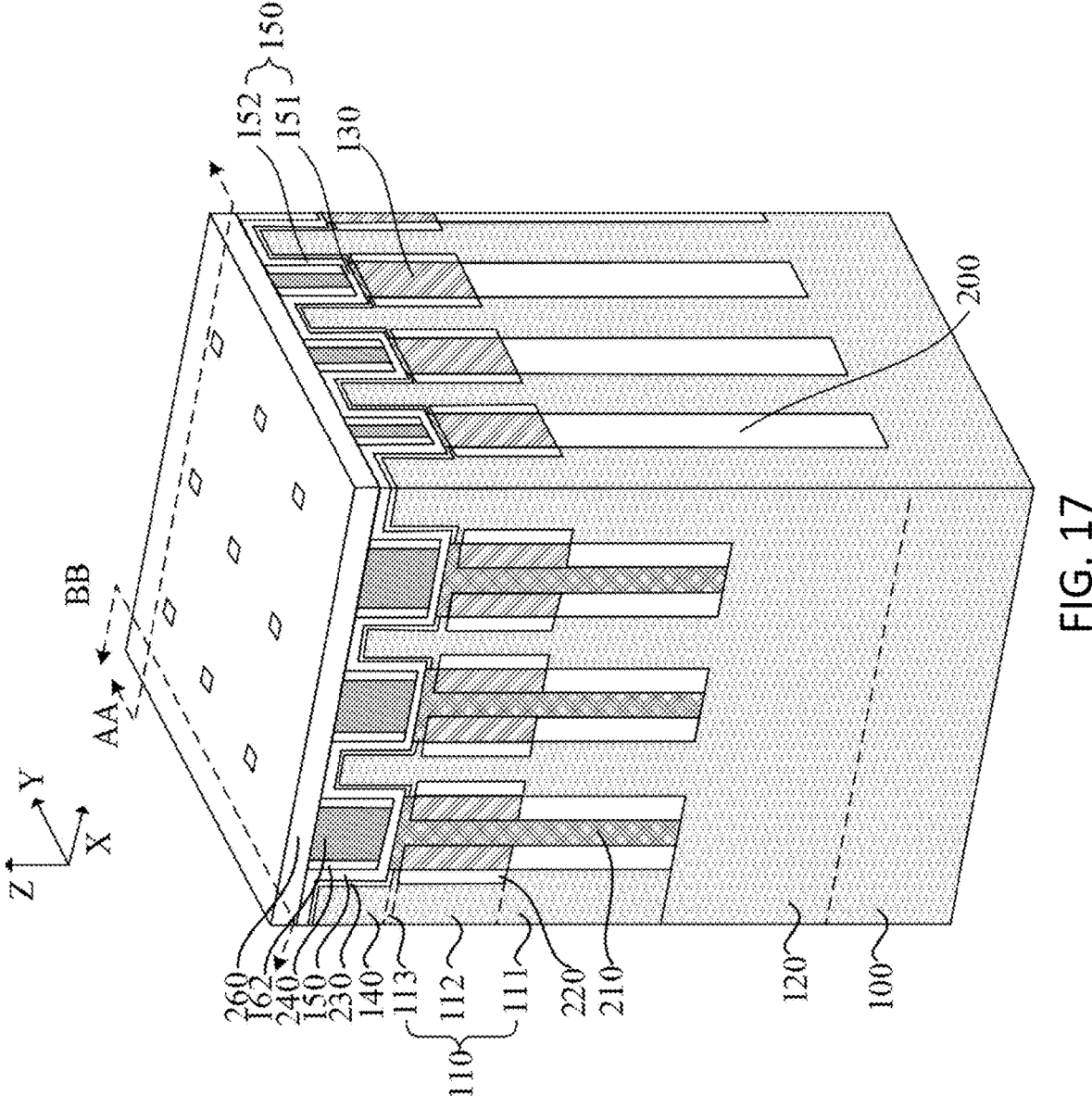
Figure 18:
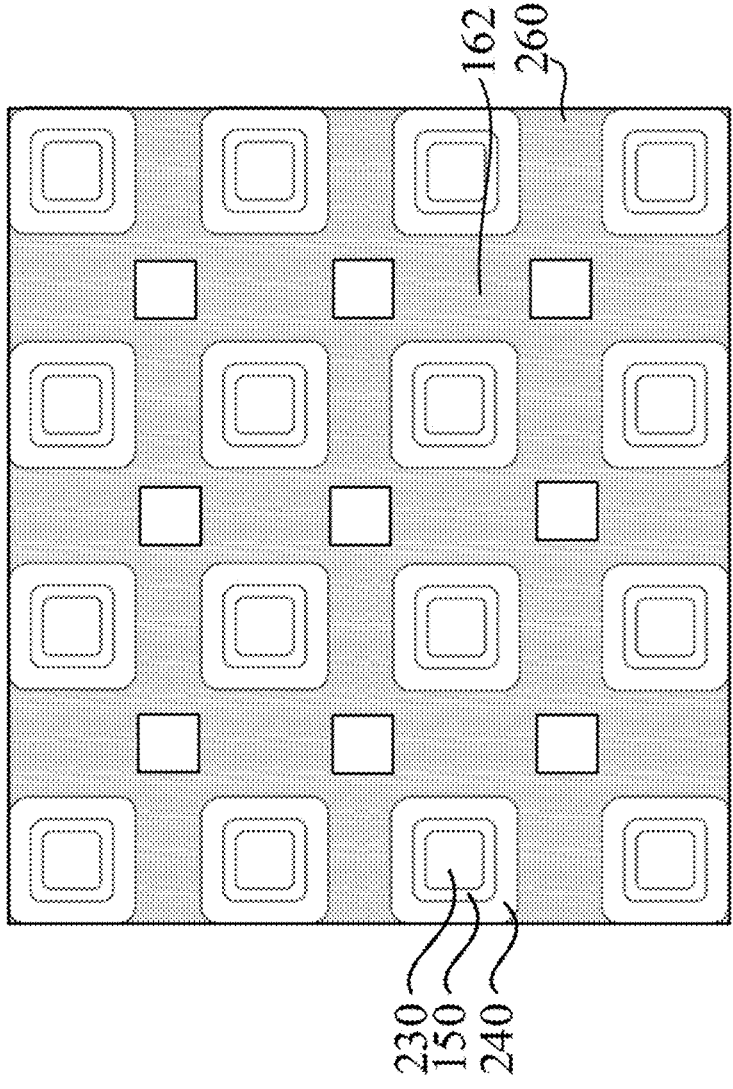
Figure 19:
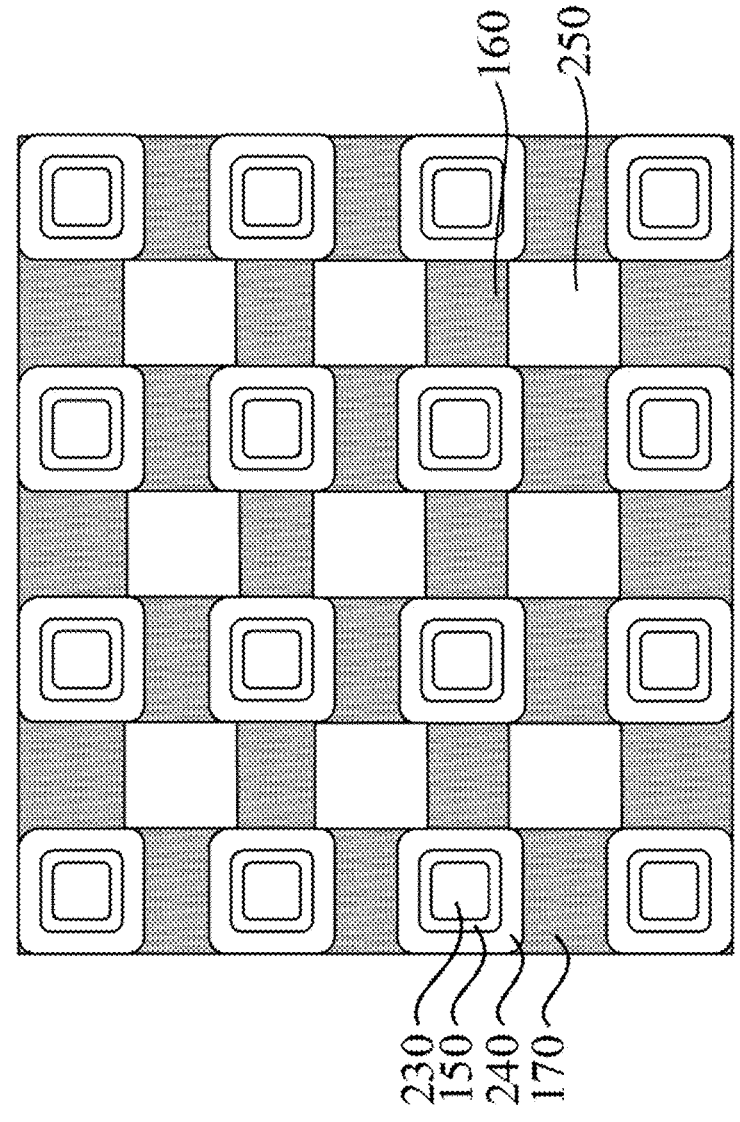

Referring to FIGS. 17 to 19, in some embodiments, the method of etching the doped layer 162 includes: using a self-aligned process to etch the doped layer 162 to form an initial groove, and the initial groove runs through the doped layer 162; the doped layer 162 is etched in the initial grooves by means of over-etching to form the initial groove, the first semiconductor doped layer 160 and the second semiconductor doped layer 170. The pattern of the self-alignment process can be the pattern used for forming the semiconductor channel, which can reduce the steps of forming the mask pattern at one time, simplify the process steps, and reduce the difficulty of the process.

Referring to FIG. 17, a protective layer 260 is formed, and an initial groove is formed by a self-alignment process. The protective layer 260 covers the surface of the doped layer 162 and the channel layer 150. The protective layer 260 can be used to prevent the etching solution from interacting with the channel layer 150 is in contact, so that the channel layer 150 can be prevented from being polluted, and the reliability of the semiconductor structure can be improved.

Referring to FIG. 18, FIG. 18 is a top view of the semiconductor structure shown in FIG. 17. It can be seen that the initial grooves do not form the first semiconductor doped layer 162 spaced along the first direction X and the second direction Y. layer 160 and the second semiconductor doped layer 170, so it is also necessary to etch part of the doped layer 162 by means of over-etching.

Referring to FIG. 19, the doped layer 162 is etched to form the first semiconductor doped layer 160 and the second semiconductor doped layer 170 arranged at intervals.

Continuing to refer to FIGS. 17 to 19, in other embodiments, the method of etching the doped layer 162 includes: forming a mask layer (not shown in the figure), the mask layer covering the top surface of the doped layer 162, and the mask layer includes a target pattern, the length of the target pattern is equal to the distance between the adjacent first isolation layers 240 in the first direction X, and the width of the target pattern is equal to the distance between the adjacent first isolation layers 240 in the second direction Y. The distance between the doped layers 162 is etched by using the mask layer as a mask to form the first semiconductor doped layer 160 and the second semiconductor doped layer 170; wherein, the target pattern corresponds to the final pattern to be formed, that is, The first semiconductor doped layer 160 and the second semiconductor doped layer 170 are arranged at intervals, that is, the first semiconductor doped layer 160 and the second semiconductor doped layer 170 are directly formed by means of mask etching. The pattern formed by mask etching is more precise.

Continuing to refer to FIG. 19, in some embodiments, the method further includes: forming a second isolation layer 250, and the second isolation layer 250 is located between the adjacent first semiconductor doped layers 160 and the adjacent second semiconductor doped layers 170, The second isolation layer 250 is filled with the groove formed by etching the doped layer 162. By forming the second isolation layer 250, the insulation between the first semiconductor doped layer 160 and the adjacent second semiconductor doped layer 170 can be improved. And filling the gap between the first semiconductor doped layer 160 and the second semiconductor doped layer 170 can facilitate subsequent process steps.

Figure 20:
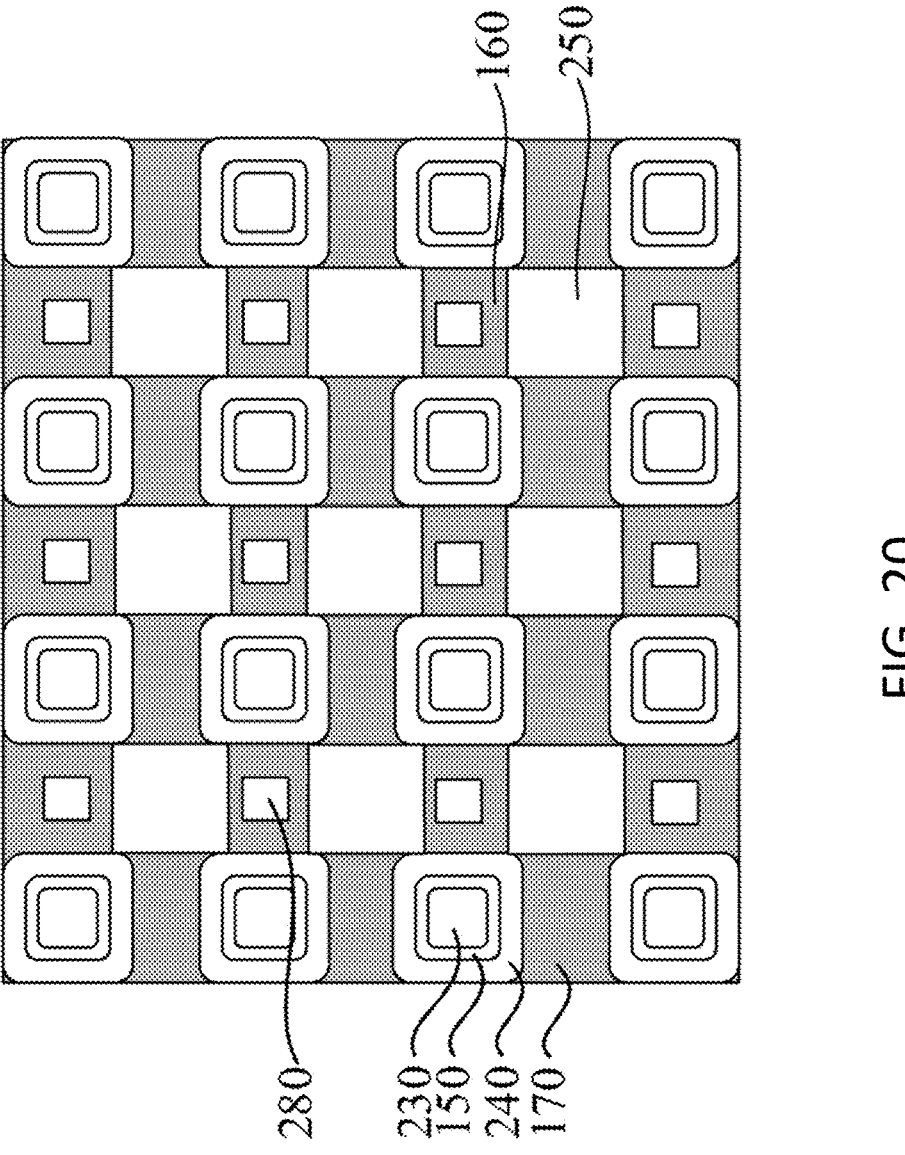

Referring to FIG. 20, in some embodiments, before forming the second bit line, the method further includes: forming a conductive plug 280, and the conductive plug 280 is located on top of one of the first semiconductor doped layer 160 or the second semiconductor doped layer 170. The surface is used for electrical connection with the subsequently formed second bit line contact.

Figure 21:
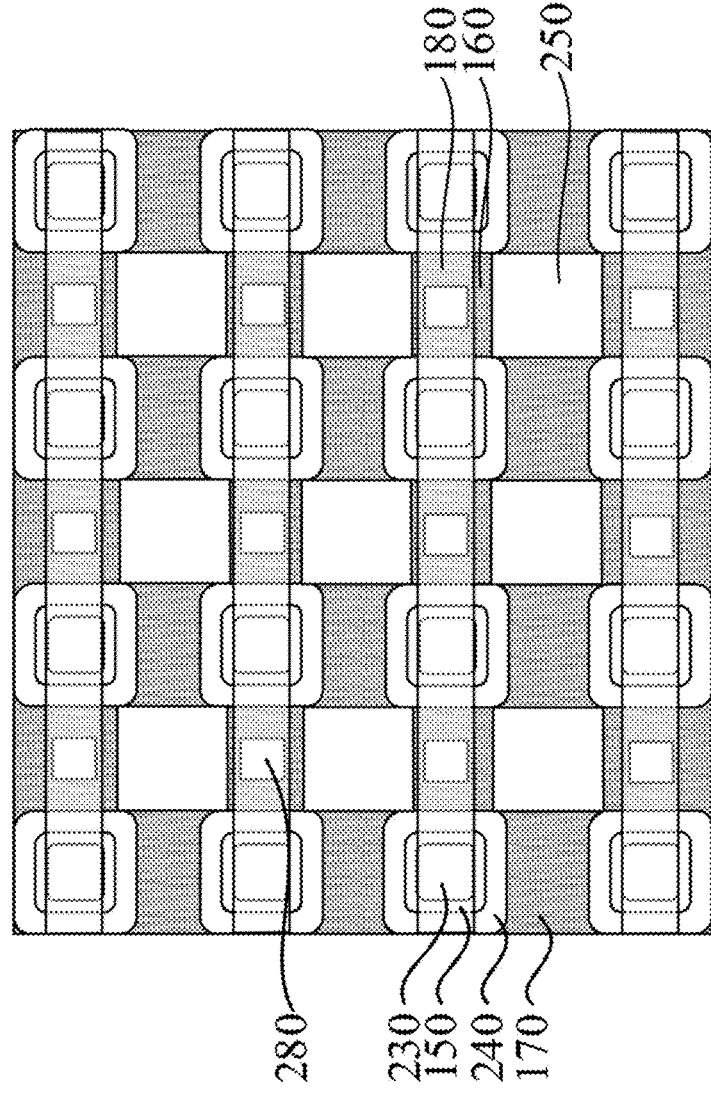

Referring to FIG. 21, a second bit line 180 is formed.

Referring to FIGS. 2, 3 and 4, the conductive plug 280, the third insulating layer 270 and the second word line 190 are formed in sequence. It can be understood that the conductive plug 280 formed in this step is located in the first semiconductor doped layer 160 or the other top surface of the second semiconductor doped layer 170 is used for electrical connection with the second word line 190, and the third insulating layer 270 is used for isolating the second bit line 180 and the second word line 190, the conductive plug formed in one step also penetrates the third insulating layer 270.

In this embodiment of the present disclosure, the first doped region 111 is formed as one of the source or drain of the first transistor, the channel region 112 is used as the gate of the first transistor, and the second doped region 113 is formed as the first transistor. Either the source or the drain of a transistor, and by forming the first bit line 120 in contact with the first doped region 111, can store charge to the gate of the second transistor when the first transistor is turned on, or the charge of the gate of the second transistor is exported, the first word line 130 surrounding the channel region 112 is formed to control the conduction of the first transistor, the gate conductive layer 140 is formed as the gate of the second transistor, and the channel layer 150 is formed as the channel of the second transistor, by forming the first semiconductor doped layer 160 and the second semiconductor doped layer 170 respectively as the source and drain of the second transistor, when the gate of the second transistor receives the charge from the first transistor, The turn-on of the second transistor can be controlled by measuring the second bit line 180 electrically connected to one of the first semiconductor doped layer 160 or the second semiconductor doped layer 170 and the second bit line 180 electrically connected to the first semiconductor doped layer 160 or the voltage difference between the second word lines 190 electrically connected to the other of the second semiconductor doped layers 170 can determine the voltage corresponding to the transistors corresponding to the second word line 190 and the second bit line 180. In a constant voltage state, the fabrication method of the semiconductor structure provided by the embodiments of the present disclosure can reduce the fabrication difficulty of the semiconductor structure and improve the integration degree of the semiconductor structure.

Those skilled in the art can understand that the above-mentioned embodiments are specific examples for realizing the present disclosure, and in practical applications, various changes can be made in form and details without departing from the scope of the embodiments of the present disclosure. spirit and scope. Any person skilled in the art can make respective changes and modifications without departing from the spirit and scope of the embodiments of the present disclosure. Therefore, the protection scope of the embodiments of the present disclosure should be based on the scope defined by the claims.

The invention claimed is:

1. A semiconductor structure, comprising:
   a substrate;
   a plurality of semiconductor channels disposed on the substrate and spaced apart along a first direction and a second direction, wherein each of the plurality of semiconductor channels comprises:
   a first doped region, a channel region, and a second doped region, arranged in sequence along a third direction, wherein each of the plurality of semiconductor channels constitutes a first transistor;
   a plurality of first bit lines extending along the first direction and spaced apart along the second direction, wherein the plurality of first bit lines is disposed between the substrate and the plurality of semiconductor channels, wherein each of the plurality of first bit lines is in contact with the first doped region to which it corresponds;
   a plurality of first word lines extending along the second direction and spaced apart along the first direction, wherein each of the plurality of first word lines surrounds the channel region;
   a gate conductive layer, wherein the gate conductive layer is disposed on a side of the second doped region away from the channel region, and is in contact with the second doped region, and a width of the gate conductive layer is smaller than a width of a corresponding one of each of the semiconductor channels of the plurality of semiconductor channels of the second doped region;

a channel layer, wherein the channel layer is arranged around an outer side of the gate conductive layer;

a first semiconductor doped layer and a second semiconductor doped layer, wherein the first semiconductor doped layer and the second semiconductor doped layer are arranged on an outer side of the channel layer, wherein the first semiconductor doped layer is spaced apart from the second semiconductor doped layer, and wherein the first semiconductor doped layer, the second semiconductor doped layer, the channel layer, and the gate conductive layer constitute a second transistor;

a second bit line, wherein the second bit line electrically connects to one of the first semiconductor doped layer or the second semiconductor doped layer; and a second word line, wherein the second word line electrically connects to another one of the first semiconductor doped layer or the second semiconductor doped layer;

wherein the channel layer comprises a flat portion and a protruding portion, wherein the protruding portion surrounds the gate conductive layer, wherein the flat portion and the protruding portion are connected, wherein the first semiconductor doped layer is arranged on an outer side surface of the protruding portion along one of the first direction or the second direction, wherein the first semiconductor doped layer connects, by contacting, with a top surface of the flat portion; wherein the second semiconductor doped layer is disposed on an outer side surface of the protruding portion along another one of the first direction or the second direction, and wherein the second semiconductor doped layer connects, by contacting, with the top surface of the flat portion.

2. The semiconductor structure according to claim 1, wherein the semiconductor structure further comprises:

a first gate dielectric layer, wherein the first gate dielectric layer surrounds a surface of the gate conductive layer and is in contact with the gate conductive layer; wherein the channel layer surrounds a surface of the first gate dielectric layer and is in contact with the first gate dielectric layer; and a first isolation layer, wherein the first isolation layer surrounds a part of a surface of the channel layer and is in contact with the channel layer.

3. The semiconductor structure according to claim 2, further comprising: a second isolation layer, wherein the second isolation layer is disposed between an adjacent first semiconductor doped layer and an adjacent second semiconductor doped layer.

4. The semiconductor structure of claim 3, wherein a material of the first isolation layer is different from a material of the second isolation layer.

5. The semiconductor structure according to claim 1, wherein the channel layer is doped with first dopant ions, wherein the first semiconductor doped layer is doped with second dopant ions, and wherein a type of the first dopant ions is different from a type of the second dopant ions.

6. The semiconductor structure according to claim 1, wherein the gate conductive layer and a corresponding one of each of the semiconductor channels of the plurality of semiconductor channels form one integrated structure.

7. The semiconductor structure according to claim 1, wherein the first semiconductor doped layer is arranged along the first direction, and wherein two adjacent gate conductive layers in the first direction are connected with said first semiconductor doped layer.

8. The semiconductor structure according to claim 1, further comprising: a protective layer, wherein the protective layer is disposed on a top surface of the channel layer, a part of a surface of the first semiconductor doped layer, and a part of a surface of the second semiconductor doped layer; wherein the second bit line is configured to penetrate through the protective layer and is in contact with one of the first semiconductor doped layer or the second semiconductor doped layer; and wherein the second word line is configured to penetrate through the protective layer and is in contact with another one of the first semiconductor doped layer or the second semiconductor doped layer.

9. A method for making a semiconductor structure, comprising:

providing a substrate;

forming a plurality of semiconductor channels and a gate conductive layer on the substrate, wherein the plurality of semiconductor channels and the gate conductive layer are arranged spaced apart along a first direction and a second direction; wherein each of the plurality of semiconductor channels comprises a first doped region, a channel region, and a second doped region arranged in sequence along a third direction; wherein each of the plurality of semiconductor channels constitutes a first transistor, wherein the gate conductive layer is disposed on one side of the second doped region away from the channel region and is in contact with the second doped region, and a width of the gate conductive layer is smaller than a width of a corresponding one of each of the semiconductor channels of the plurality of semiconductor channels of the second doped region; and forming a plurality of first bit lines extending along the first direction and spaced apart along the second direction, wherein the plurality of first bit lines are disposed between the substrate and the plurality of semiconductor channels, wherein each of the plurality of first bit lines is in contact with the first doped region to which it corresponds;

forming a plurality of first word lines extending along the second direction and spaced apart along the first direction, wherein the plurality of first word lines surrounds the channel region;

forming a channel layer, wherein the channel layer is disposed around an outer side surface of the gate conductive layer;

forming a first semiconductor doped layer and a second semiconductor doped layer, wherein the first semiconductor doped layer and the second semiconductor doped layer are configured to be on an outer side of the channel layer, wherein the first semiconductor doped layer is spaced apart from the second semiconductor doped layer, and wherein the first semiconductor doped layer, the second semiconductor doped layer, the channel layer, and the gate conductive layer constitute a second transistor;

forming a second bit line electrically connected to one of the first semiconductor doped layer or the second semiconductor doped layer; and forming a second word line electrically connected to another one of the first semiconductor doped layer or the second semiconductor doped layer;

wherein forming the plurality of semiconductor channels and the gate conductive layer comprises:

forming initial semiconductor channels, wherein the initial semiconductor channels are disposed on the substrate and spaced apart along the first direction and the second direction, wherein the initial semiconductor channels comprise the first doped region, the plurality of semiconductor channels, and a second initial doped region sequentially arranged along the third direction; and etching a part of the second initial doped region to form the second doped region and the gate conductive layer.

10. The method for making the semiconductor structure according to claim 9, wherein before forming the channel layer, the method further comprises: forming a first gate dielectric layer, wherein the first gate dielectric layer surrounds a surface of the gate conductive layer, and is in contact with the gate conductive layer; and after forming the channel layer, the method further comprises: forming a first isolation layer, wherein the first isolation layer surrounds a surface of the channel layer and is in contact with the channel layer.

11. The method for making the semiconductor structure according to claim 10, wherein the channel layer comprises a flat portion and a protruding portion, wherein the protruding portion surrounds the gate conductive layer, and wherein the flat portion is connected to the protruding portion;

wherein the method for forming the first isolation layer comprises: forming a first initial isolation layer, wherein the first initial isolation layer is disposed on the surface of the channel layer; and etching the first initial isolation layer to expose a top surface of the protruding portion and a top surface of the flat portion, wherein remaining of the first initial isolation layer after the etch becomes the first isolation layer.

12. The method for making the semiconductor structure according to claim 11, wherein forming the first semiconductor doped layer and the second semiconductor doped layer comprises:

forming an initial doped layer, wherein the initial doped layer is disposed on a top surface of the first isolation layer and the surface of the channel layer;

etching the initial doped layer to expose the top surface of the first isolation layer and the surface of the channel layer, and leaving remaining of the initial doped layer after the etch as a doping layer; and etching the doping layer to form a groove, wherein the groove exposes a part of sidewalls of the first isolation layer and the top surface of the flat portion, and wherein remaining of the doping layer constitutes the first semiconductor doped layer and the second semiconductor doped layer.

13. The method for making the semiconductor structure according to claim 12, wherein the method for etching the doping layer comprises:

forming a mask layer, wherein the mask layer is disposed on a top surface of the doping layer, wherein the mask layer comprises a target pattern, wherein a length of the target pattern is equal to a spacing between two adjacent first isolation layers in the first direction, and wherein a width of the target pattern is equal to a spacing between two adjacent first isolation layers in the second direction; and etching the doping layer using the mask layer as a mask to form the first semiconductor doped layer and the second semiconductor doped layer.

14. The method for making the semiconductor structure according to claim 12, wherein the method for etching the doping layer comprises:

etching the doping layer to form an initial groove by applying a self-aligned process, wherein the initial groove penetrates the doping layer; and etching the initial groove of the doping layer by means of over-etching to form the groove, the first semiconductor doped layer and the second semiconductor doped layer.

15. The method for making the semiconductor structure according to claim 9, further comprising: forming a second isolation layer, wherein the second isolation layer is disposed between an adjacent first semiconductor doped layer and an adjacent second semiconductor doped layer.

* * * * *